(12) United States Patent
Jeon et al.

(10) Patent No.: US 12,295,136 B2
(45) Date of Patent: May 6, 2025

(54) INTEGRATED CIRCUIT SEMICONDUCTOR DEVICE

(71) Applicant: Samsung Electronics Co., Ltd., Suwon-si (KR)

(72) Inventors: Intak Jeon, Seoul (KR); Hyukwoo Kwon, Seoul (KR); Hanjin Lim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 382 days.

(21) Appl. No.: 17/844,623

(22) Filed: Jun. 20, 2022

(65) Prior Publication Data
US 2023/0117391 A1    Apr. 20, 2023

(30) Foreign Application Priority Data

Oct. 20, 2021    (KR) .................. 10-2021-0140490

(51) Int. Cl.
*H10B 12/00* (2023.01)
*H01L 49/02* (2006.01)

(52) U.S. Cl.
CPC ........... *H10B 12/315* (2023.02); *H01L 28/90* (2013.01); *H10B 12/033* (2023.02)

(58) Field of Classification Search
CPC ...... H10B 12/30; H10B 12/31; H10B 12/315; H01L 28/40; H01L 28/90; H01L 28/91; H01L 28/92
See application file for complete search history.

(56) References Cited

U.S. PATENT DOCUMENTS

| | | |
|---|---|---|
| 8,790,986 B2 | 7/2014 | Choi et al. |
| 10,032,778 B2 | 7/2018 | Kim et al. |
| 11,114,398 B2 | 9/2021 | Kim et al. |
| 11,211,447 B2 | 12/2021 | Kwon et al. |
| 11,251,262 B2 | 2/2022 | Hsiao et al. |
| 2002/0022317 A1 | 2/2002 | Fukuzumi |

(Continued)

FOREIGN PATENT DOCUMENTS

| | | |
|---|---|---|
| KR | 1020080060304 A | 7/2008 |
| KR | 100925032 B1 | 11/2009 |

(Continued)

OTHER PUBLICATIONS

First Office Action issued Jul. 27, 2023 for corresponding TW Patent Application No. 111139432.

*Primary Examiner* — Zandra V Smith
*Assistant Examiner* — Molly K Reida
(74) *Attorney, Agent, or Firm* — Muir Patent Law, PLLC

(57) ABSTRACT

An integrated circuit semiconductor device includes a lower electrode formed on a substrate extending in a first direction and a second direction perpendicular to the first direction and a support structure supporting the lower electrode. The support structure includes a support pattern surrounding the lower electrode, extending in the first direction and the second direction, and having a hole through which the lower electrode passes, and a concavo-convex structure having at a surface of the support pattern a plurality of convex portions extending in a third direction perpendicular to the first direction and the second direction, and a plurality of concave portions arranged between the convex portions.

20 Claims, 24 Drawing Sheets

(56) References Cited

U.S. PATENT DOCUMENTS

| | | | |
|---|---|---|---|
| 2006/0113575 A1 | 6/2006 | Jang et al. | |
| 2008/0030968 A1 | 2/2008 | Mashino | |
| 2021/0118705 A1 | 4/2021 | Choi et al. | |
| 2021/0159230 A1 | 5/2021 | Choi et al. | |
| 2022/0392996 A1* | 12/2022 | Takaba | H10B 12/318 |

FOREIGN PATENT DOCUMENTS

| | | |
|---|---|---|
| KR | 1020130067136 A | 6/2013 |
| KR | 1020180070911 A | 6/2018 |
| KR | 1020190076820 A | 7/2019 |
| KR | 1020200010913 A | 1/2020 |
| KR | 1020210032844 A | 3/2021 |
| KR | 1020210047739 A | 4/2021 |
| KR | 1020210063577 A | 6/2021 |
| TW | 202121653 A | 6/2021 |
| TW | 202137309 A | 10/2021 |

* cited by examiner

INTEGRATED CIRCUIT SEMICONDUCTOR DEVICE

CROSS-REFERENCE TO RELATED APPLICATIONS

This application is based on and claims priority under 35 U.S.C. § 119 to Korean Patent Application No. 10-2021-0140490, filed on Oct. 20, 2021, in the Korean Intellectual Property Office, the disclosure of which is incorporated by reference herein in its entirety.

BACKGROUND

The inventive concept relates to an integrated circuit semiconductor device, and more particularly, to an integrated circuit semiconductor device including a capacitor.

With the development of electronic technologies, downscaling of integrated circuit semiconductor devices has been expanded drastically, and accordingly, patterns constituting an integrated circuit semiconductor device have also been miniaturized. In tandem with such a tendency, there has been a demand for development of a structure having a miniaturized capacitor with improved capacitance while maintaining desired electrical properties.

SUMMARY

The inventive concept provides an integrated circuit semiconductor device capable of preventing tilting or falling down of lower electrodes even when a height of the lower electrodes constituting a capacitor is increased, and is thereby capable of controlling occurrence of a bridge defect between adjacent lower electrodes. A bridge defect refers to a phenomenon in which a leakage current is generated due to a formation of a undesired current path (i.e., a "bridge") between adjacent electrodes. For example, when an electrode is tilted or falls down so as to contact or become in close proximity to an adjacent electrode, an undesired current path (i.e., bridge) between the electrodes may be formed.

According to an aspect of the inventive concept, there is provided an integrated circuit semiconductor device including a lower electrode formed on a substrate extending in a first direction and a second direction perpendicular to the first direction and a support structure supporting the lower electrode. The support structure includes a support pattern surrounding the lower electrode, extending in the first direction and the second direction, and having a first hole through which the lower electrode passes, and a concavo-convex structure having at a surface of the support pattern a plurality of convex portions extending in a third direction perpendicular to the first direction and the second direction, and a plurality of concave portions arranged between the convex portions.

According to another aspect of the inventive concept, there is provided an integrated circuit semiconductor device including: a plurality of lower electrodes spaced apart from each other on a substrate extending in a first direction and a second direction perpendicular to the first direction; a support pattern extending in the first direction and the second direction and having a plurality of first holes through which the plurality of lower electrodes pass; and a concavo-convex structure having at a surface of the support pattern a plurality of convex portions extending in a third direction perpendicular to the first direction and the second direction, and a plurality of concave portions arranged between the convex portions.

According to another aspect of the inventive concept, there is provided an integrated circuit semiconductor device including: a plurality of lower electrodes spaced apart from each other on a substrate extending in a first direction and a second direction perpendicular to the first direction; an upper support structure including an upper support pattern extending in the first direction and the second direction and having a plurality of first holes through which the plurality of lower electrodes pass, and an upper concavo-convex structure having at a surface of the upper support pattern a plurality of upper convex portions extending in a third direction perpendicular to the first direction and the second direction, and a plurality of upper concave portions arranged between the plurality of convex portions; a lower support structure including a lower support pattern extending in the first direction and the second direction between the substrate and the upper support structure, and a lower concavo-convex structure having at a surface of the lower support pattern a plurality of lower convex portions extending in the third direction, and a plurality of lower concave portions arranged between the lower convex portions; a dielectric film in contact with the plurality of lower electrodes, the upper support structure, and the lower support structure; and an upper electrode facing the plurality of lower electrodes with the dielectric film interposed therebetween.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
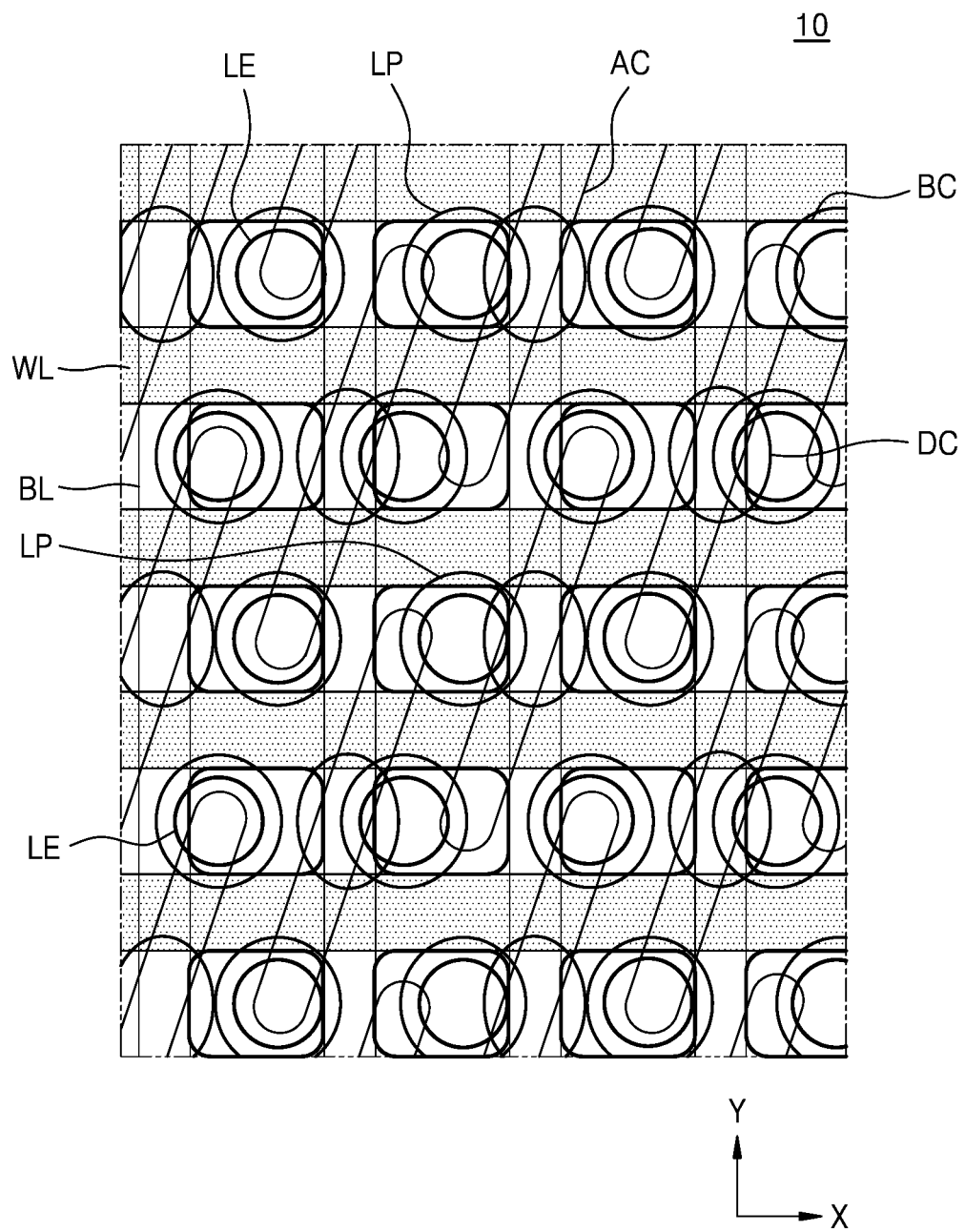
FIG. 1 is a schematic plan layout for explaining some components of a memory cell array area of an integrated circuit semiconductor device according to an embodiment.

Hereinafter, embodiments of the inventive concept are described in detail with reference to the accompanying drawings. Like reference numerals in the drawings denote like elements, and thus their description will be omitted.

FIG. 1 is a schematic plan layout for explaining some components of a memory cell array area of an integrated circuit semiconductor device according to an embodiment.

Specifically, an integrated circuit semiconductor device 10, for example, a dynamic random access memory (DRAM) device, may include a plurality of active areas AC arranged to extend horizontally in a diagonal direction of an X direction and a Y direction on a plane. A plurality of word lines WL may extend in parallel with each other in the X direction across the plurality of active areas AC. On the plurality of word lines WL, a plurality of bit lines BL may extend in parallel with each other in the Y direction intersecting with the X direction. Each of the plurality of bit lines BL may be connected to the active area AC through a direct contact DC.

A plurality of buried contacts BC may be formed between two adjacent bit lines among the plurality of bit lines BL. A plurality of conductive landing pads LP may be respectively formed on the plurality of buried contacts BC. Each of the plurality of conductive landing pads LP may be arranged to overlap at least a portion of the buried contact BC. A plurality of lower electrodes LE spaced apart from each other may be respectively formed on the plurality of conductive landing pads LP. The plurality of lower electrodes LE may be connected to the plurality of active areas AC through the plurality of buried contacts BC and the plurality of conductive landing pads LP.

Figure 2:
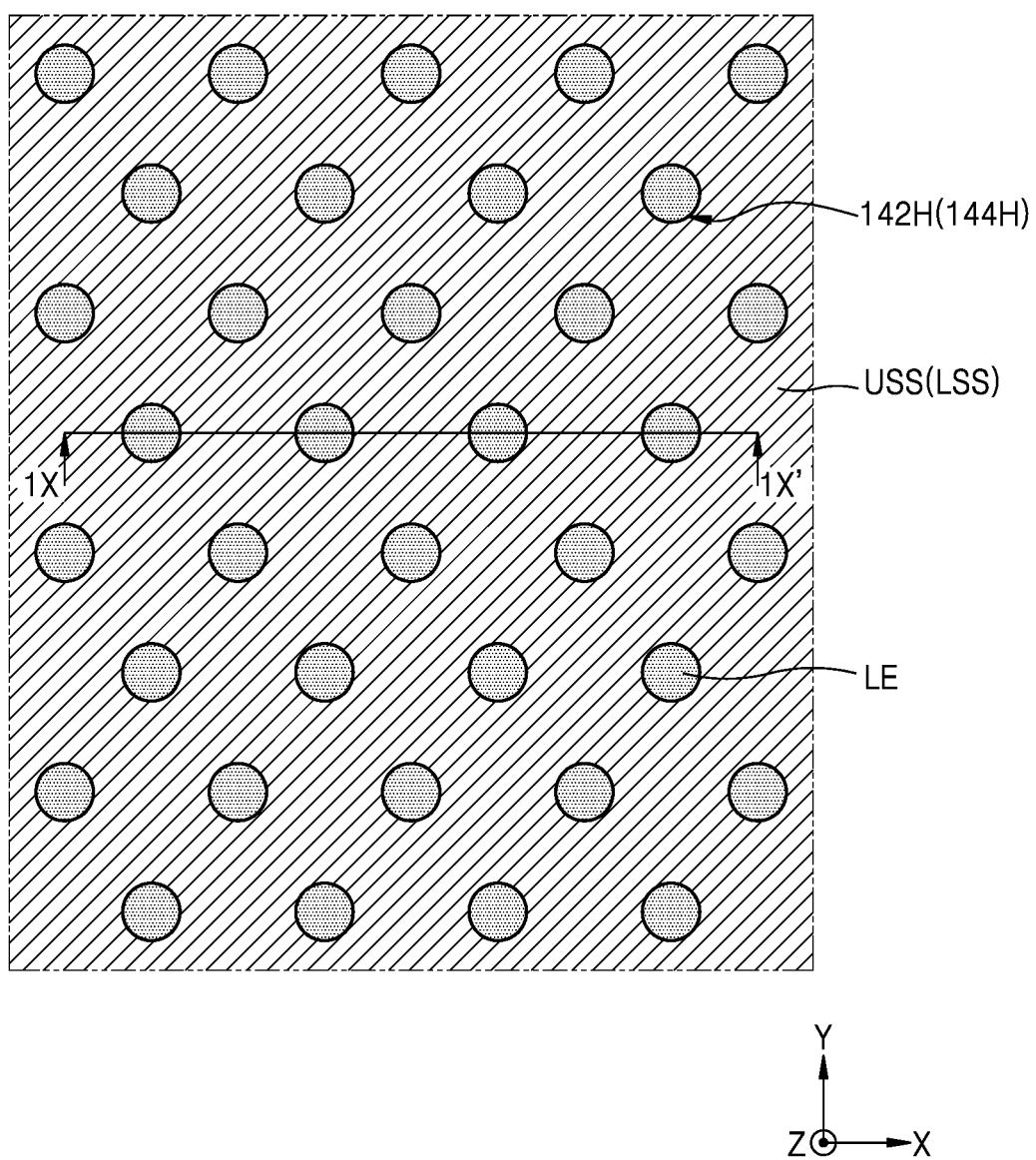
FIG. 2 is a plan view showing some components of an integrated circuit semiconductor device according to an embodiment.
Figure 3:
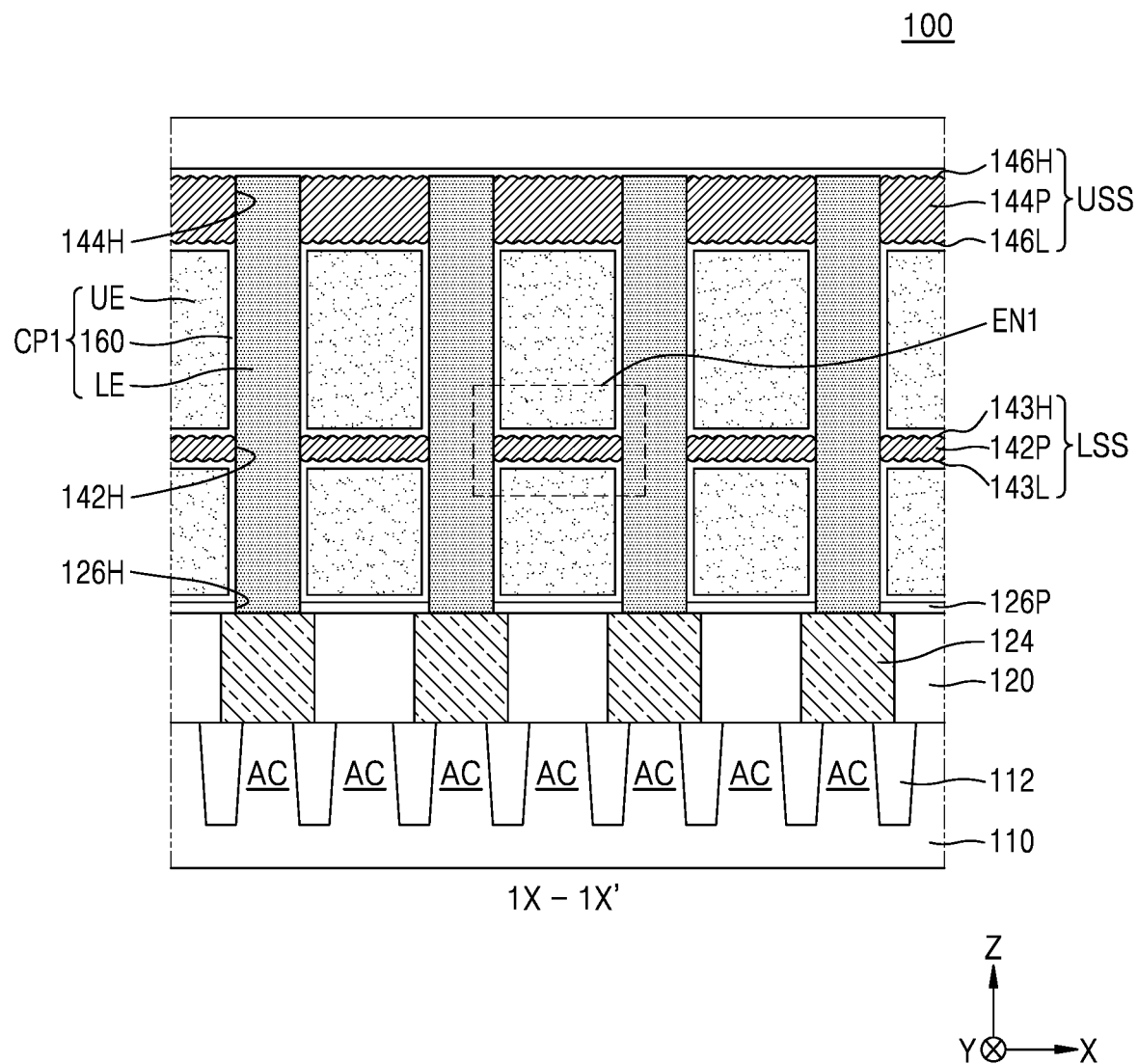
FIG. 3 is a cross-sectional view schematically showing some components of a cross-section taken along the 1X-1X' line of FIG. 2.

FIG. 2 is a plan view showing some components of an integrated circuit semiconductor device according to an embodiment, and FIG. 3 is a cross-sectional view schematically showing some components of a cross-section taken along the 1X-1X' line of FIG. 2.

Specifically, FIG. 2 may be a plan view of an upper support structure USS and a lower support structure LSS of FIG. 3. An integrated circuit semiconductor device 100 of FIGS. 2 and 3 may constitute a part of the integrated circuit semiconductor device 10 of FIG. 1.

Some of the components of the integrated circuit semiconductor device 100 are omitted or simplified in FIGS. 2 and 3. However, the components of the integrated circuit semiconductor device 100 are not limited to the components illustrated in FIGS. 2 and 3, and should be construed as including characteristic components described below.

The integrated circuit semiconductor device 100 may include a substrate 110 including a plurality of active areas AC and a lower structure 120 formed on the substrate 110. A plurality of conductive areas 124 may pass through the lower structure 120 and be connected to the plurality of active areas AC.

The substrate 110 may include elemental semiconductors, such as Si and Ge, or compound semiconductors, such as SiC, GaAs, InAs, and InP. The substrate 110 may include a semiconductor substrate, at least one insulating film formed on the semiconductor substrate, or structures including at least one conductive area. The conductive area may include a well doped with impurities or a structure doped with impurities. A device separation area 112 may be formed in the substrate 110 and define the plurality of active areas AC. The device separation area 112 may include an oxide film, a nitride film, or a combination thereof.

In some embodiments, the lower structure 120 may include a silicon oxide film, a silicon nitride film, or an insulating film including a combination thereof. In other embodiments, the lower structure 120 may include various conductive areas, for example, a wiring layer, a contact plug, a transistor, etc., and an insulating film to insulate the various conductive areas.

The plurality of conductive areas 124 may include polysilicon, metal, conductive metallic nitride, metal silicide, or a combination thereof. The lower structure 120 may include the plurality of bit lines BL described with reference to FIG. 1. Each of the plurality of conductive areas 124 may include the buried contact BC and the conductive landing pad LP described with reference to FIG. 1.

An insulating pattern 126P having a plurality of openings 126H may be arranged on the lower structure 120 and the plurality of conductive areas 124. The insulating pattern 126P may include or may be formed of a silicon nitride film, a silicon carbon nitride film, a silicon nitride film including boron, or a combination thereof. Although a plurality of the same structures, devices, films, layers, openings, etc. are included in the integrated semiconductor device 10, for the sake of clarity, the singular forms "a", "an" and "the" will be used throughout the description and are intended to include the plural forms as well, unless the context clearly indicates otherwise.

A capacitor CP1 including the lower electrode LE, a dielectric film 160, and an upper electrode UE may be arranged on the conductive area 124. Lower electrode LE may have a pillar shape extending in a direction away from the substrate 110 in a vertical direction (Z direction) through the opening 126H of the insulating pattern 126P from an upper surface of the conductive area 124. The dielectric film 160 and the upper electrode UE may be formed in this stated order on the plurality of lower electrodes LE. For example, a portion of the dielectric film 160 may be formed between the upper electrode UE and the lower electrode.

FIGS. 2 and 3 illustrate an example in which the lower electrode LE has a pillar shape; however, the technical aspects of the inventive concept are not limited thereto. For example, the lower electrode LE may have a cross-section structure having a cup shape or a cylindrical shape with a blocked bottom. The lower electrode LE and the upper electrode UE may be arranged to face each other with respect to the dielectric film 160.

The lower electrode LE and the upper electrode UE may respectively include or may be formed of a metal film, a conductive metal oxide film, a conductive metal nitride film, a conductive metal oxynitride film, or a combination thereof. In some embodiments, the lower electrode LE and the upper electrode UE may each include or may be formed of Ti, Ti oxide, Ti nitride, Ti oxynitride, Co, Co oxide, Co nitride, Co oxynitride, Nb, Nb oxide, Nb nitride, Nb oxynitride, Sn, Sn oxide, Sn nitride, Sn oxynitride, or a combination thereof.

For example, the lower electrode LE and the upper electrode UE may respectively include or may be formed of TiN, CoN, NbN, $SnO_2$, or a combination thereof; however, the inventive concept is not limited thereto. The dielectric film 160 may include $HfO_2$, $ZrO_2$, $Al_2O_3$, $La_2O_3$, $Ta_2O_3$, $Nb_2O_5$, $CeO_2$, $TiO_2$, $GeO_2$, or a combination thereof however, the inventive concept is not limited thereto.

The lower electrode LE may be supported by an upper support structure USS and a lower support structure LSS. The lower support structure LSS may support a lower portion of the lower electrode LE. The upper support structure USS may be apart from the lower support structure LSS in the vertical direction (Z direction) perpendicular to the substrate 110, and support an upper portion of the lower electrode LE. For example, the upper support structure USS may not contact the lower support structure LSS.

The upper support structure USS may include an upper support pattern 144P and upper concavo-convex structures (i.e., a first upper concavo-convex structure 146L and a second upper concavo-convex structure 146H). The upper support pattern 144P may surround an upper portion the lower electrode LE and extend in a horizontal direction parallel with the substrate 110.

A hole 144H through which the plurality of lower electrodes LE pass may be formed in the upper support pattern 144P. An interior surface of the upper support pattern 144p exposed by the hole 144H, may contact and surround an exterior surface of the lower electrode LE. The upper concavo-convex structures may include the first upper concavo-convex structure 146L and the second upper concavo-convex structure 146H arranged at a lower surface and an upper surface of the upper support pattern 144P, respectively. The first upper concavo-convex structure 146L and the second upper concavo-convex structure 146H may respectively include upper convex portions and upper concave portions.

In some embodiments, the first upper concavo-convex structure 146L and the second upper concavo-convex structure 146H may be nano-concavo-convex structures obtained by adjusting a thickness uniformity in the Z-direction of the upper support pattern 144P. The nano-concavo-convex structure may be a concavo-convex structure of several nanometers. In some embodiments, the first upper concavo-convex structure 146L and the second upper concavo-convex structure 146H may be nano-concavo-convex structures obtained by adjusting a surface roughness of the upper support pattern 144P.

In some embodiments, the first upper concavo-convex structure 146L and the second upper concavo-convex structure 146H may be cluster structures (e.g., an aggregation of structures located in close proximity to each other) formed on the upper support pattern 144P. As illustrated in FIG. 3, for example, The concavo-convex arrangement of the first upper concavo-convex structure 146L and the second upper concavo-convex structure 146H may be uniform. However, in some embodiments, the concavo-convex arrangement may be irregular (i.e., not uniform).

The upper support pattern 144P, the first upper concavo-convex structure 146L, and the second upper concavo-convex structure 146H may include or may be formed of a silicon carbon nitride film, a silicon nitride film including boron, or a combination thereof. In some embodiments, the upper support pattern 144P, the first upper concavo-convex structure 146L, and the second upper concavo-convex structure 146H may include or may be formed of the same material.

The lower support structure LSS may include a lower support pattern 142P and lower concavo-convex structures (i.e., a first lower concavo-convex structure 143L and a second lower concavo-convex structure 143H). The lower support pattern 142P may extend in a horizontal direction parallel with the substrate 110. The lower support pattern 142P may be disposed at a level in the Z-direction that is between the substrate 110 and the upper support pattern 144P. The lower support pattern 142P may be in contact with the lower electrode LE.

A hole 142H through which the lower electrode LE passes may be formed in the lower support pattern 142P. The lower electrode LE may pass through the hole 144H formed in the upper support pattern 144P and the hole 142H formed in the lower support pattern 142P in the vertical direction (Z direction). An interior surface of the lower support pattern 142P exposed by the hole 142H, may contact and surround an exterior surface of the lower electrode LE.

The lower concavo-convex structures may include the first lower concavo-convex structure 143L and the second lower concavo-convex structure 143H arranged at a lower surface and an upper surface of the lower support pattern 142P, respectively. In some embodiments, the first lower concavo-convex structure 143L and the second lower concavo-convex structure 143H may be nano-concavo-convex structures obtained by adjusting a thickness uniformity in the Z-direction of the lower support pattern 142P. The first lower concavo-convex structure 143L and the second lower concavo-convex structure 143H may respectively include lower convex portions and lower concave portions.

In some embodiments, the first lower concavo-convex structure 143L and the second lower concavo-convex structure 143H may be nano-concavo-convex structures obtained by adjusting a surface roughness of the lower support pattern 142P. In some embodiments, the first lower concavo-convex structure 143L and the second lower concavo-convex structure 143H may be cluster structures (e.g., an aggregation of structures located in close proximity to each other) formed on the lower support pattern 142P. As illustrated in FIG. 3, for example, the concavo-convex arrangement of the first lower concavo-convex structure 143L and the second lower concavo-convex structure 143H may be uniform. However, in some embodiments, the concavo-convex arrangement may be irregular (i.e., not uniform).

The lower support pattern 142P, the first lower concavo-convex structure 143L, and the second lower concavo-convex structure 143H may include or may be formed of a silicon carbon nitride film, a silicon nitride film including boron, or a combination thereof. In some embodiments, the lower support pattern 142P, the first lower concavo-convex structure 143L, and the second lower concavo-convex structure 143H may include the same material.

In some embodiments, the upper support structure USS and the lower support structure LSS may include or may be formed of the same material. In an embodiment, the upper support structure USS and the lower support structure LSS may include or may be formed of a silicon carbon nitride film. In some embodiments, the upper support structure USS and the lower support structure LSS may include or may be formed of different materials.

In an embodiment, the upper support structure USS may include or may be formed of a silicon carbon nitride film, and the lower support structure LSS may include or may be formed of a silicon nitride film including boron. However, according to embodiments of the inventive concept, the materials included in the upper support structure USS and the lower support structure LSS are not limited to the foregoing examples, and various changes and modifications may be made within the scope of the technical aspects of the inventive concept.

Although the integrated circuit semiconductor device 100 of the embodiment is described as including two support structures, i.e., the upper support structure USS and the lower support structure LSS, more support structures may be included in the integrated circuit semiconductor device 100. As illustrated in FIG. 3, for example, the upper support structure USS of the integrated circuit semiconductor device 100 of the embodiment may have a thickness in the Z-direction greater than that of the lower support structure LSS. However, the thickness of the upper support structure USS of the integrated circuit semiconductor device 100 may be less than that of the lower support structure LSS. However, the thicknesses of the upper support structure USS and the lower support structure LSS are not limited thereto.

In the integrated circuit semiconductor device 100, a space between upper portions of each of the plurality of lower electrodes LE may be filled with the upper support structure USS. In the integrated circuit semiconductor device 100, a space between lower portions of each of the plurality of lower electrodes LE may be filled with the lower support structure LSS. Accordingly, even when a height of the plurality of lower electrodes LE is increased, and an aspect ratio becomes relatively greater to improve the capacitance of the plurality of capacitors CP1, the plurality of lower electrodes LE may extend in a substantially perpendicular direction (i.e., Z-direction) with respect to a top surface of the substrate 110 (extending in the X and Y-directions). For example, as a result of the upper support structures USS and the lower support structures LSS being disposed between the lower electrodes LE, the lower electrodes LE may not be inclined or fall down.

Through the first upper concavo-convex support structure 146L and the second upper concavo-convex support structure 146H included in the upper support structure USS and the first lower concavo-convex support structure 143L and the second lower concavo-convex support structure 143H included in the lower support structure LSS, the integrated circuit semiconductor device 100 may suppress the occurrence of a bridge by increasing a surface length between adjacent lower electrodes LE.

Figure 4:
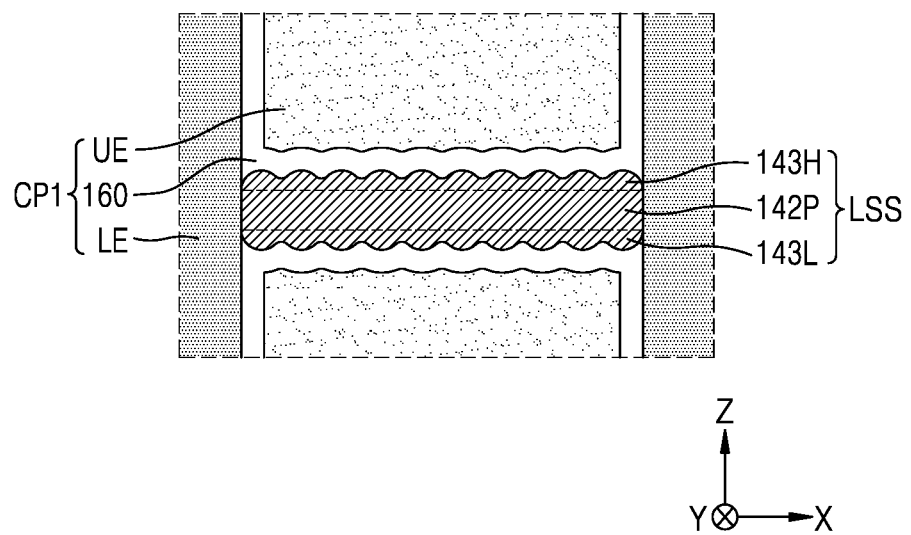
FIGS. 4 and 5 are enlarged cross-sectional views for explaining a lower support structure of an integrated circuit semiconductor device according to an embodiment.
Figure 5:
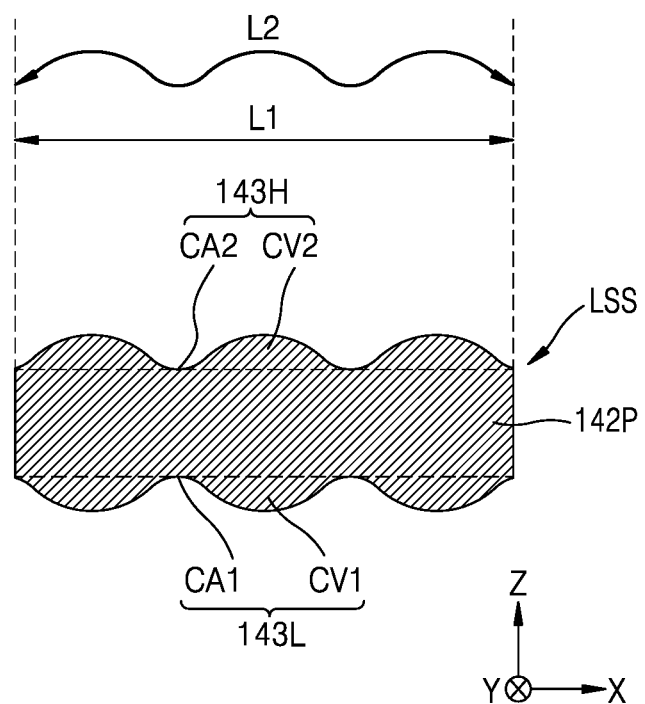

FIGS. 4 and 5 are enlarged cross-sectional views for explaining a lower support structure of an integrated circuit semiconductor device according to an embodiment.

Specifically, FIG. 4 is an enlarged cross-sectional view of a part EN1 of FIG. 3, and FIG. 5 is an enlarged cross-sectional view of the lower support structure LSS of FIG. 4. In the integrated circuit semiconductor device 100 of FIG. 3, the lower support structure LSS may be arranged between the plurality of lower electrodes LE.

The lower support structure LSS may include a lower support pattern 142P and lower concavo-convex structures (i.e., a first lower concavo-convex structure 143L and a second lower concavo-convex structure 143H). The lower support pattern 142P may be in contact with the plurality of lower electrodes LE. In some embodiments, the lower support pattern 142P, the first lower concavo-convex structure 143L, and the second lower concavo-convex structure 143H may include or may be formed of the same material.

The lower concavo-convex structures may include the first lower concavo-convex structure 143L and the second lower concavo-convex structure 143H arranged at a lower surface and an upper surface of the lower support pattern 142P, respectively. The first lower concavo-convex structure 143L may include a plurality of first convex portions CV1 and a plurality of first concave portions CA1 arranged between the first convex portions CV1. The second lower concavo-convex structure 143H may include a plurality of second convex portions CV2 and a plurality of second concave portions CA2 arranged between the second convex portions CV2.

In some embodiments, the first lower concavo-convex structure 143L and the second lower concavo-convex structure 143H may be nano-concavo-convex structures obtained by adjusting the thickness uniformity in the Z-direction or the surface roughness of the lower support pattern 142P. For example, the first lower concavo-convex structure 143L and the second lower concavo-convex structure 143H may be obtained by changing a deposition rate, a deposition gas, or a deposition process parameter of a lower support film 142 (see FIG. 14B), and adjusting the thickness uniformity in the Z-direction or the surface roughness of the lower support film 142, when depositing the lower support film 142 to form the lower support pattern 142P.

In some embodiments, the first lower concavo-convex structure 143L and the second lower concavo-convex structure 143H may be cluster structures formed on the lower support pattern 142P. The arrangement of the first convex portions CV1 and the second convex portions CV2 constituting the first lower concavo-convex structure 143L and the second lower concavo-convex structure 143H as illustrated with reference to FIGS. 4 and 5 may be uniform. However, in some embodiments, the arrangement of the first convex portions CV1 and the second convex portions CV2 of the first lower concavo-convex structure 143L and the second lower concavo-convex structure 143H may be irregular (i.e., not uniform).

In some embodiments, the first lower concavo-convex structure 143L and the second lower concavo-convex structure 143H may have a wave shape having valleys and ridges. In some embodiments, the first lower concavo-convex structure 143L and the second lower concavo-convex structure 143H may have an elliptical cross-section.

When the integrated circuit semiconductor device 100 of FIG. 3 includes the first lower concavo-convex structure 143L and the second lower concavo-convex structure 143H, the occurrence of a bridge between the lower electrodes LE may be suppressed by increasing a surface length L2 of the lower support structure LSS as illustrated in FIG. 5. For example, by increasing the surface length L2, the distance that an electron must travel between the adjacent lower electrodes LE is increased. Therefore, a bridge between the lower electrodes LE may be suppressed.

For example, the reference symbol L1 in FIG. 5 may denote a surface length of the lower support structure without the first lower concavo-convex structure 143L and the second lower concavo-convex structure 143H. For example, if the lower support structure LSS did not include the first lower concavo-convex structure 143L and the second lower concavo-convex structure 143H, the top and bottom surfaces (extending in the X and Y-directions) of the lower support structure would be substantially planar. As such, the surface length in the X-direction of the top surface of the lower support structure LSS and the bottom surface of the lower support structure LSS would each be equal to L1. Moreover, L1 is equal to the distance between the respective lower electrodes LE between which the lower support structure LSS is disposed. Accordingly, L1 may also denote a distance between the lower electrodes LE as illustrated in FIG. 5.

The reference symbol L2 in FIG. 5 may denote the surface length in the X-direction of the lower support structure LSS between the lower electrodes LE. As a result of the of the inclusion of the first lower concavo-convex structure 143L and the second lower concavo-convex structure 143H, L2 is greater than L1. Accordingly, the integrated circuit semiconductor device 100 of FIG. 3 may suppress the occurrence of a bridge between the lower electrodes LE by increasing the surface length L2 of the lower support structure LSS between the lower electrodes LE to be greater than the distance L1 between the lower electrodes LE.

In FIGS. 4 and 5, the inventive concept takes an example of the lower support structure LSS including the lower support pattern 142P, the first lower concavo-convex structure 143L, and the second lower concavo-convex structure 143H for convenience; however, the inventive concept may also be applied to the upper support structure USS including the upper support pattern 144P, the first upper concavo-convex structure 146L, and the second upper concavo-convex structure 146H. Hereinafter, the technical aspects of the inventive concept are described by taking the lower support structure LSS as an example for convenience.

Figure 6:
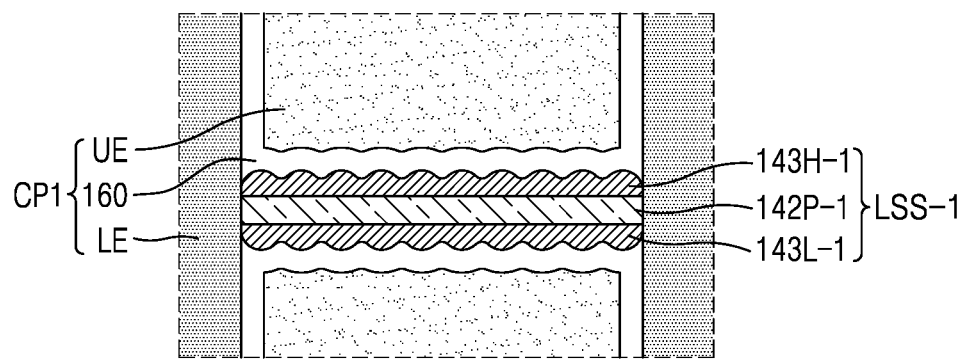
FIGS. 6 and 7 are enlarged cross-sectional views for explaining a lower support structure of an integrated circuit semiconductor device according to an embodiment.
Figure 7:
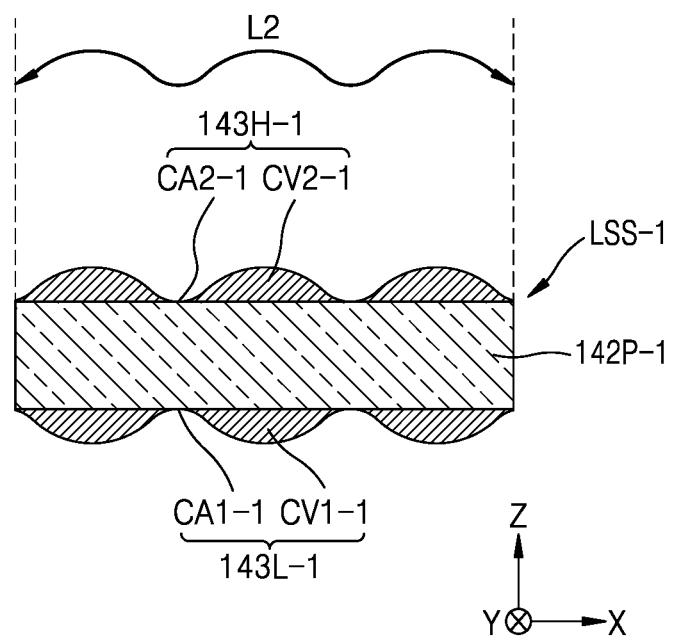

FIGS. 6 and 7 are enlarged cross-sectional views for explaining a lower support structure of an integrated circuit semiconductor device according to an embodiment.

Specifically, a lower support structure LSS-1 of FIGS. 6 and 7 may be another embodiment of the lower support structure LSS of FIGS. 4 and 5. FIG. 7 is an enlarged cross-sectional view of the lower support structure LSS-1 of FIG. 6. In FIGS. 6 and 7, reference numerals identical or similar to the reference numerals in FIGS. 4 and 5 denote identical or similar elements.

In the integrated circuit semiconductor device 100 of FIG. 3, the lower support structure LSS-1 may be arranged between the plurality of lower electrodes LE. The lower support structure LSS-1 may include a lower support pattern 142P-1 and lower concavo-convex structures (i.e., a first lower concavo-convex structure 143L-1 and a second lower concavo-convex structure 143H-1). The lower support pattern 142P-1, the first lower concavo-convex structure 143L-1, and the second lower concavo-convex structure 143H-1 may be structurally distinguished from each other. A lower surface and an upper surface of the lower support pattern 142P-1 may be a flat (e.g., substantially planar) surface parallel with the substrate 110 of FIG. 3.

The lower concavo-convex structures may include the first lower concavo-convex structure 143L-1 and the second lower concavo-convex structure 143H-1 arranged at a lower surface and an upper surface of the lower support pattern 142P-1, respectively. The first lower concavo-convex structure 143L-1 may include a plurality of first convex portions CV1-1 and a plurality of first concave portions CA1-1 arranged between the first convex portions CV1-1. The second lower concavo-convex structure 143H-1 may include a plurality of second convex portions CV2-1 and a plurality of second concave portions CA2-1 arranged between the second convex portions CV2-1.

In some embodiments, the first lower concavo-convex structure 143L-1 and the second lower concavo-convex structure 143H-1 may be cluster structures formed on the lower support pattern 142P-1. As illustrated in FIGS. 6 and 7, the arrangement of the first convex portions CV1-1 and the second convex portions CV2-1 constituting the first lower concavo-convex structure 143L-1 and the second lower concavo-convex structure 143H-1 may be uniform. However, in some embodiments, the arrangement of the first convex portions CV1-1 and the second convex portions CV2-1 of the first lower concavo-convex structure 143L-1 and the second lower concavo-convex structure 143H-1 may be irregular (i.e., not uniform).

In some embodiments, the lower support pattern 142P-1, the first lower concavo-convex structure 143L-1, and the second lower concavo-convex structure 143H-1 may include or may be formed of different materials. In some embodiment, when the lower support pattern 142P-1, the first lower concavo-convex structure 143L-1, and the second lower concavo-convex structure 143H-1 include or are formed of different materials, the first lower concavo-convex structure 143L-1 and the second lower concavo-convex structure 143H-1 may be formed by controlling an etching speed of a material included in the first lower concavo-convex structure 143L-1 and the second lower concavo-convex structure 143H-1.

In some embodiments, the first lower concavo-convex structure 143L-1 and the second lower concavo-convex structure 143H-1 may be nano-concavo-convex structures obtained by a lithography process performed on the lower support pattern 142P-1. For example, the lower concavo-convex structures may include the first lower concavo-convex structure 143L-1 and the second lower concavo-convex structure 143H-1 obtained by a lithography process performed on the lower support pattern 142P-1.

The lithography process may be a photolithography process using photoresist or a block copolymer lithography using block copolymer.

In some embodiments, the first lower concavo-convex structure 143L-1 and the second lower concavo-convex structure 143H-1 may have a wave shape having valleys and ridges. In some embodiments, the first lower concavo-convex structure 143L-1 and the second lower concavo-convex structure 143H-1 may have an elliptical cross-section.

When the integrated circuit semiconductor device 100 of FIG. 3 includes the first lower concavo-convex structure 143L-1 and the second lower concavo-convex structure 143H-1, the occurrence of a bridge between the lower electrodes LE may be suppressed by increasing a surface length L2 between the lower electrodes LE as illustrated in FIG. 7.

Figure 8:
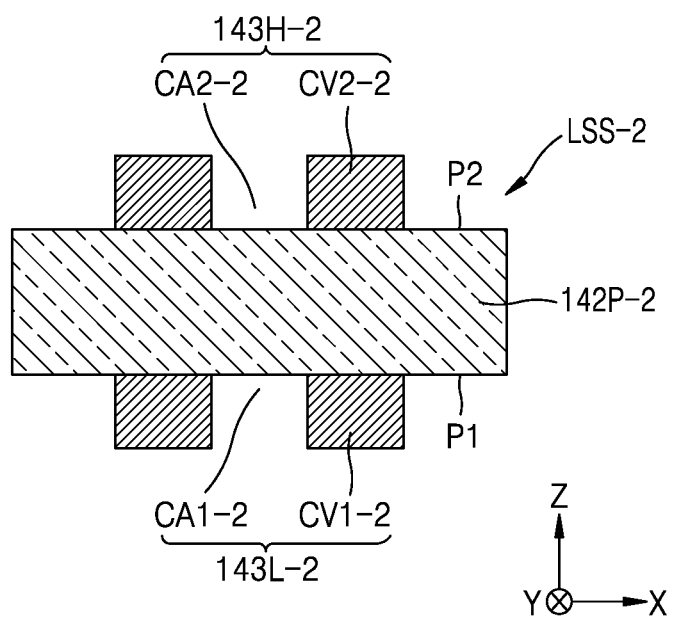
FIG. 8 is an enlarged cross-sectional view for explaining a lower support structure of an integrated circuit semiconductor device according to an embodiment.

FIG. 8 is an enlarged cross-sectional view for explaining a lower support structure of an integrated circuit semiconductor device according to an embodiment.

Specifically, a lower support structure LSS-2 of FIG. 8 may be another embodiment of the lower support structure LSS of FIGS. 4 and 5. In FIG. 8, reference numerals identical or similar to the reference numerals in FIGS. 4 and 5 denote identical or similar elements.

The lower support structure LSS-2 may include a lower support pattern 142P-2 and lower concavo-convex structures (i.e., a first lower concavo-convex structure 143L-2 and a second lower concavo-convex structure 143H-2). The lower support pattern 142P-2, the first lower concavo-convex structure 143L-2, and the second lower concavo-convex structure 143H-2 may be structurally distinguished from each other. A lower surface P1 and an upper surface P2 of the lower support pattern 142P-2 may be a flat (e.g., substantially planar) surface.

In some embodiments, the lower support pattern 142P-2, the first lower concavo-convex structure 143L-2, and the second lower concavo-convex structure 143H-2 may include or may be formed of the same material. In some embodiments, the lower support pattern 142P-2, the first lower concavo-convex structure 143L-2, and the second lower concavo-convex structure 143H-2 may include or may be formed of different materials.

The lower concavo-convex structures may include the first lower concavo-convex structure 143L-2 and the second lower concavo-convex structure 143H-2 arranged at a lower surface and an upper surface of the lower support pattern 142P-2, respectively. The first lower concavo-convex structure 143L-2 may include a plurality of first convex portions CV1-2 and a plurality of first concave portions CA1-2 arranged between the first convex portions CV1-2. The second lower concavo-convex structure 143H-2 may include a plurality of second convex portions CV2-2 and a plurality of second concave portions CA2-2 arranged between the second convex portions CV2-2.

In some embodiments, the first lower concavo-convex structure 143L-2 and the second lower concavo-convex structure 143H-2 may be nano-concavo-convex structures obtained by a lithography process performed on the lower support pattern 142P-2. For example, the lower concavo-convex structures may include the first lower concavo-convex structure 143L-2 obtained by a lithography process on a mold film and the second lower concavo-convex structure 143H-2 obtained by a lithography process performed on the lower support pattern 142P-2.

The lithography process may be a photolithography process using photoresist or a block copolymer lithography using block copolymer.

In some embodiments, the first lower concavo-convex structure 143L-2 and the second lower concavo-convex structure 143H-2 may have a stair shape. In some embodiments, the first lower concavo-convex structure 143L-2 and the second lower concavo-convex structure 143H-2 may have a rectangular cross-section. In some embodiments, the first lower concavo-convex structure 143L-2 and the second lower concavo-convex structure 143H-2 may have a wave shape having ridges and valleys, unlike in FIG. 8.

When the integrated circuit semiconductor device 100 of FIG. 3 includes the first lower concavo-convex structure 143L-2 and the second lower concavo-convex structure 143H-2, the occurrence of a bridge between the lower electrodes LE of FIG. 3 may be suppressed by increasing a surface length of the lower support structure LSS-2 between the lower electrodes LE of FIG. 3.

Figure 9:
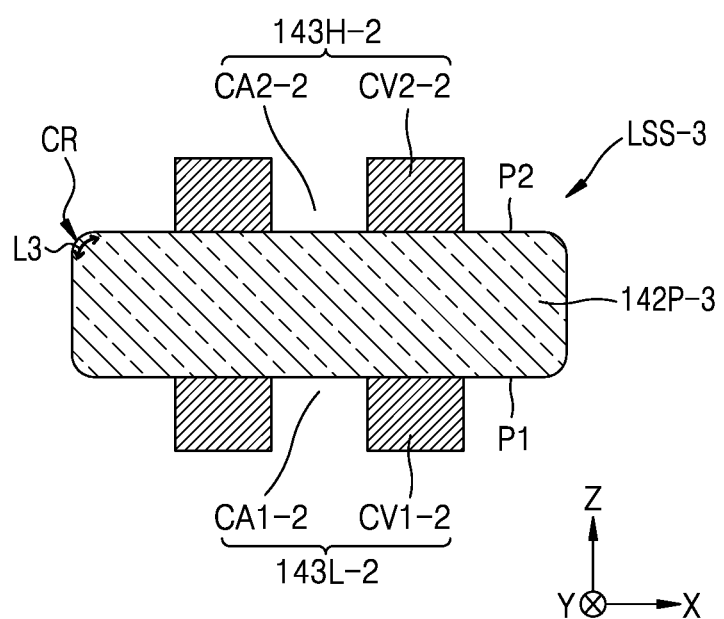
FIG. 9 is an enlarged cross-sectional view for explaining a lower support structure of an integrated circuit semiconductor device according to an embodiment.

FIG. 9 is an enlarged cross-sectional view for explaining a lower support structure of an integrated circuit semiconductor device according to an embodiment.

Specifically, a lower support structure LSS-3 may be another embodiment of the lower support structure LSS of FIGS. 4 and 5. The lower support structure LSS-3 of FIG. 9 may be identical to the lower support structure LSS-2 of FIG. 8 except for a corner portion CR of a lower support pattern 142P-3. In FIG. 9, reference numerals identical or similar to the reference numerals in FIGS. 4, 5, and 8 denote identical or similar elements.

The lower support structure LSS-3 may include the lower support pattern 142P-3 and lower concavo-convex structures (i.e., a first lower concavo-convex structure 143L-2 and a second lower concavo-convex structure 143H-2). The lower support pattern 142P-3, the first lower concavo-convex structure 143L-2, and the second lower concavo-convex structure 143H-2 may be structurally distinguished from each other.

In some embodiments, the lower support pattern 142P-3, the first lower concavo-convex structure 143L-2, and the second lower concavo-convex structure 143H-2 may include or may be formed of the same material. In some embodiments, the lower support pattern 142P-3, the first lower concavo-convex structure 143L-2, and the second lower concavo-convex structure 143H-2 may include or may be formed of different materials.

A lower surface P1 and an upper surface P2 of the lower support pattern 142P-3 may be a flat (e.g., substantially planar) surface. The corner portion CR of the lower support pattern 142P-3 may have a curved surface. The corner portion CR of the lower support pattern 142P-3 may be in contact with the lower electrode LE (see FIG. 4). The corner portion CR of the lower support pattern 142P-3 may have a curved surface having a thickness tapering off towards the lower electrode LE (see FIG. 4).

When a curved surface is formed at the corner portion CR of the lower support pattern 142P-3, the lower support structure LSS-3 may suppress the occurrence of a bridge between lower electrodes LE (see FIG. 3) by increasing a surface length of the lower support structure LSS-3 between the lower electrodes LE (see FIG. 3) through inclusion of the lower concavo-convex structures and the corner portion CR. The reference L3 may denote the length of the corner portion CR.

The lower support structure LSS-3 may include the first lower concavo-convex structure 143L-2 and the second lower concavo-convex structure 143H-2. The lower concavo-convex structures may include the first lower concavo-convex structure 143L-2 and the second lower concavo-convex structure 143H-2 arranged at a lower surface and an upper surface of the lower support pattern 142P-2, respectively. As the first lower concavo-convex structure 143L-2 and the second lower concavo-convex structure 143H-2 have been described above, descriptions thereon are omitted hereinafter.

When the lower support structure LSS-3 includes the curved surface of the corner portion CR of the lower support pattern 142P-3, and the first lower concavo-convex structure 143L-2, and the second lower concavo-convex structure 143H-2 on the lower support pattern 142P-3, a surface length of the lower support structure LSS-3 between the lower electrodes LE (see FIG. 3) may be further increased to suppress the occurrence of a bridge between the lower electrodes LE (see FIG. 3).

Figure 10:
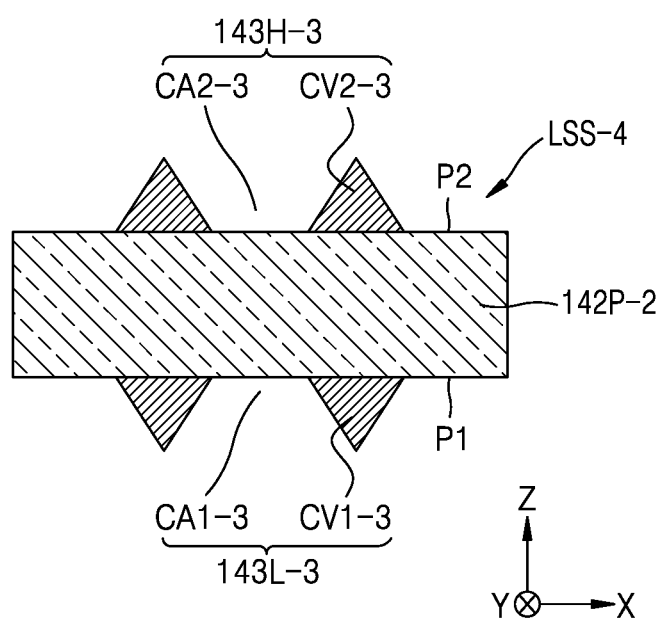
FIG. 10 is an enlarged cross-sectional view for explaining a lower support structure of an integrated circuit semiconductor device according to an embodiment.

FIG. 10 is an enlarged cross-sectional view for explaining a lower support structure of an integrated circuit semiconductor device according to an embodiment.

Specifically, a lower support structure LSS-4 may be another embodiment of the lower support structure LSS of FIGS. 4 and 5. The lower support structure LSS-4 may be identical to the lower support structure LSS-2 of FIG. 8 except for the structure of lower concavo-convex structures (i.e., a first lower concavo-convex structure 143L-3 and a second lower concavo-convex structure 143H-3). In FIG. 10, reference numerals identical or similar to the reference numerals in FIGS. 4, 5, and 8 denote identical or similar elements.

The lower support structure LSS-4 may include the lower support pattern 142P-2, the first lower concavo-convex structure 143L-3, and the second lower concavo-convex structure 143H-3. The lower support pattern 142P-2, the first lower concavo-convex structure 143L-3, and the second lower concavo-convex structure 143H-3 may be structurally distinguished from each other. A lower surface P1 and an upper surface P2 of the lower support pattern 142P-2 may be a flat (e.g., substantially planar) surface.

In some embodiments, the lower support pattern 142P-2, the first lower concavo-convex structure 143L-3, and the second lower concavo-convex structure 143H-3 may include or may be formed of the same material. In some embodiments, the lower support pattern 142P-2, the first lower concavo-convex structure 143L-3, and the second lower concavo-convex structure 143H-3 may include or may be formed of different materials.

The lower concavo-convex structures may include the first lower concavo-convex structure 143L-3 and the second lower concavo-convex structure 143H-3 arranged at a lower surface and an upper surface of the lower support pattern 142P-2, respectively. The first lower concavo-convex structure 143L-3 may include a plurality of first convex portions CV1-3 and a plurality of first concave portions CA1-3 arranged between the first convex portions CV1-3. The second lower concavo-convex structure 143H-3 may include a plurality of second convex portions CV2-3 and a plurality of second concave portions CA2-3 arranged between the second convex portions CV2-3.

In some embodiments, the first lower concavo-convex structure 143L-3 and the second lower concavo-convex structure 143H-3 may be nano-concavo-convex structures obtained by a lithography process performed on the lower support pattern 142P-2. For example, the lower concavo-convex structures may include the first lower concavo-convex structure 143L-3 obtained by a lithography process on a mold film and the second lower concavo-convex structure 143H-3 obtained by a lithography process performed on the lower support pattern 142P-2.

The lithography process may be a photolithography process using photoresist or a block copolymer lithography using block copolymer.

In some embodiments, the first convex portions CV1-3 and the second convex portions CV2-3 constituting the first lower concavo-convex structure 143L-3 and the second lower concavo-convex structure 143H-3 may have a triangular shaped cross-section. In some embodiments, the first convex portions CV1-3 and the second convex portions CV2-3 constituting the first lower concavo-convex structure 143L-3 and the second lower concavo-convex structure 143H-3 may have a diamond shaped cross-section, unlike in FIG. 10.

When the lower support structure LSS-4 includes the first lower concavo-convex structure 143L-2 and the second lower concavo-convex structure 143H-2, the occurrence of a bridge between the lower electrodes LE of FIG. 3 may be suppressed by increasing a surface length of the lower support structure LSS-4 between the lower electrodes LE of FIG. 3.

Figure 11:
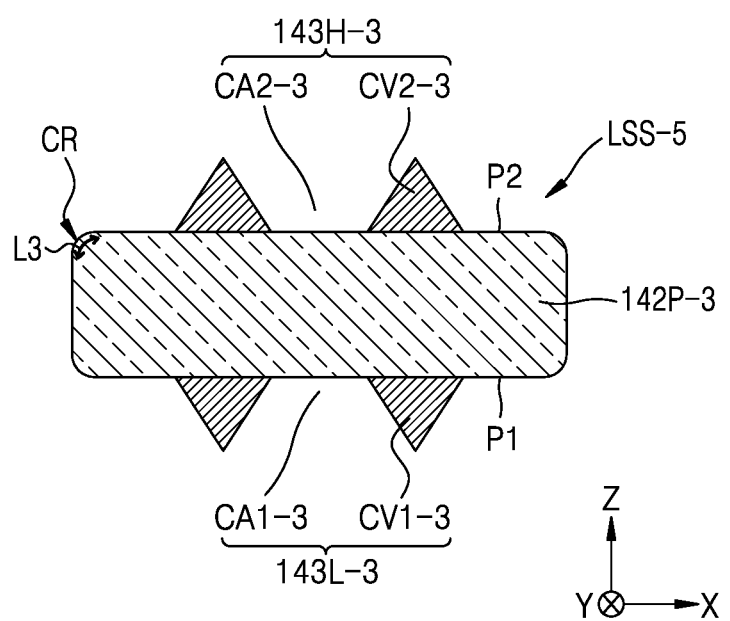
FIG. 11 is an enlarged cross-sectional view for explaining a lower support structure of an integrated circuit semiconductor device according to an embodiment.

FIG. 11 is an enlarged cross-sectional view for explaining a lower support structure of an integrated circuit semiconductor device according to an embodiment.

Specifically, a lower support structure LSS-5 may be another embodiment of the lower support structure LSS of FIGS. 4 and 5. The lower support structure LSS-5 may be identical to the lower support structure LSS-4 of FIG. 10 except for the corner portion CR of the lower support pattern 142P-3. In FIG. 11, reference numerals identical or similar to the reference numerals in FIGS. 4, 5, and 10 denote identical or similar elements.

The lower support structure LSS-5 may include the lower support pattern 142P-3 and lower concavo-convex structures (i.e., the first lower concavo-convex structure 143L-3 and the second lower concavo-convex structure 143H-3). The lower support pattern 142P-3, the first lower concavo-convex structure 143L-3, and the second lower concavo-convex structure 143H-3 may be structurally distinguished from each other.

In some embodiments, the lower support pattern 142P-3, the first lower concavo-convex structure 143L-3, and the second lower concavo-convex structure 143H-3 may include or may be formed of the same material. In some embodiments, the lower support pattern 142P-3, the first lower concavo-convex structure 143L-3, and the second lower concavo-convex structure 143H-3 may include or may be formed of different materials.

A lower surface P1 and an upper surface P2 of the lower support pattern 142P-3 may be a flat (e.g., substantially planar) surface. The corner portion CR of the lower support pattern 142P-3 may have a curved surface. The corner portion CR of the lower support pattern 142P-3 may be in contact with the lower electrode LE (see FIG. 4). The corner portion CR of the lower support pattern 142P-3 may have a curved surface having a thickness tapering off towards the lower electrode LE (see FIG. 4).

When a curved surface is formed at the corner portion CR of the lower support pattern 142P-3, the lower support structure LSS-5 may suppress the occurrence of a bridge between lower electrodes LE (see FIG. 3) by increasing a surface length of the lower support structure LSS-5 between the lower electrodes LE (see FIG. 3) through inclusion of the lower concavo-convex structures and the corner portion CR. The reference L3 may denote the length of the corner portion CR.

The lower support structure LSS-5 may include the first lower concavo-convex structure 143L-3 and the second lower concavo-convex structure 143H-3. The lower concavo-convex structures may include the first lower concavo-convex structure 143L-3 and the second lower concavo-convex structure 143H-3 arranged at a lower surface and an upper surface of the lower support pattern 142P-3, respectively. As the first lower concavo-convex structure 143L-3 and the second lower concavo-convex structure 143H-3 have been described above, descriptions thereon are omitted hereinafter.

When the lower support structure LSS-5 includes the curved surface of the corner portion CR of the lower support pattern 142P-3, the first lower concavo-convex structure 143L-3, and the second lower concavo-convex structure 143H-3 on the lower support pattern 142P-3, a surface length of the lower support structure LSS-3 between the lower electrodes LE (see FIG. 3) may be further increased to suppress the occurrence of a bridge between the lower electrodes LE (see FIG. 3).

Figure 12:
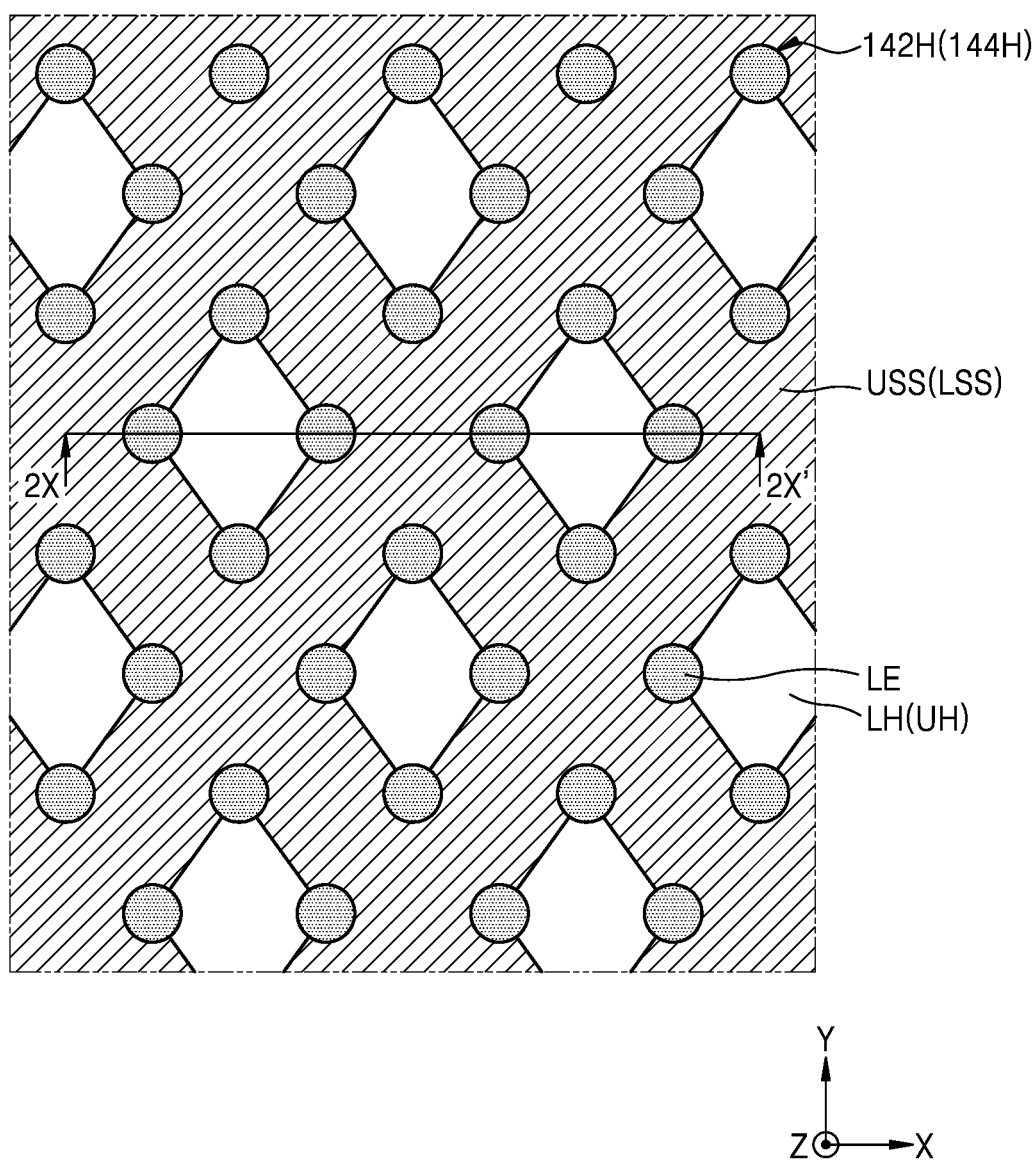
FIG. 12 is a plan view showing some components of an integrated circuit semiconductor device according to an embodiment.
Figure 13:
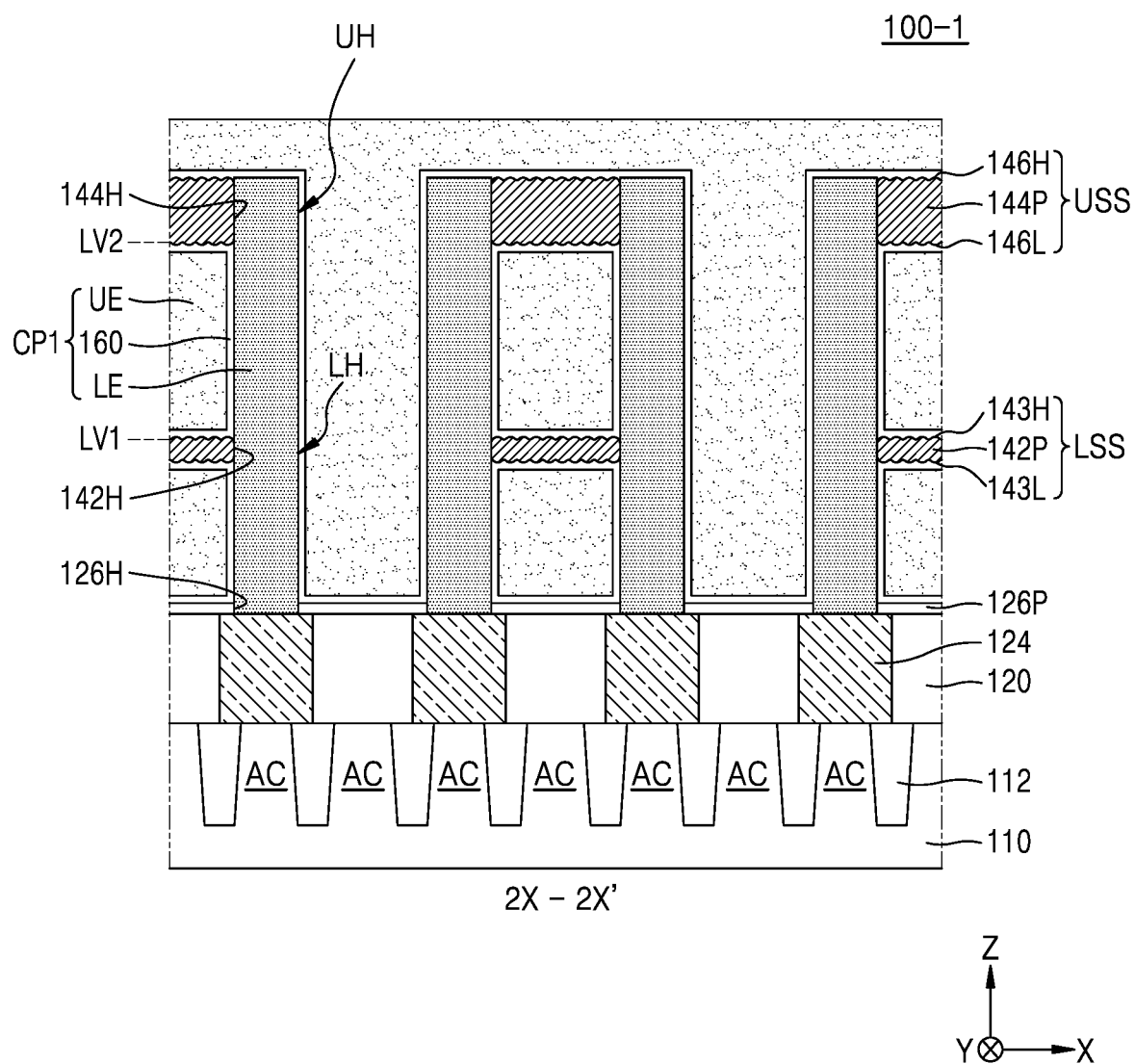
FIG. 13 is a cross-sectional view schematically showing some components of a cross-section taken along the 2X-2X' line of FIG. 12.

FIG. 12 is a plan view showing some components of an integrated circuit semiconductor device according to an embodiment, and FIG. 13 is a cross-sectional view schematically showing some components of a cross-section taken along the 2X-2X' line of FIG. 12.

Specifically, an integrated circuit semiconductor device 100-1 may be identical to the integrated circuit semiconductor device 100 of FIGS. 2 and 3 except for additional holes (i.e., lower additional holes LH and upper additional holes UH) formed between the lower electrodes LE. In FIGS. 12 and 13, reference numerals identical or similar to the reference numerals in FIGS. 2 and 3 denote identical or similar elements.

The integrated circuit semiconductor device 100-1 may include the lower electrode LE supported by the upper support structure USS and the lower support structure LSS. A plurality of holes 142H and a plurality of lower additional holes LH through which the plurality of lower electrodes LE pass may be formed in the lower support structure LSS, i.e., in the lower support pattern 142P. The plurality of holes 142H and the plurality of lower additional holes LH may be arranged on the same plane.

A plurality of holes 144H and a plurality of upper additional holes UH through which the plurality of lower electrodes LE pass may be formed in the upper support structure USS, i.e., in the upper support pattern 144P. The plurality of holes 144H and the plurality of upper additional holes UH may be arranged on the same plane.

FIG. 12 illustrates that each of the plurality of upper additional holes UH and the plurality of lower additional holes LH has a roughly diamond shaped plan view in which four adjacent lower electrodes LE are each vertex; however, the plan view may have a shape of polygon, for example, a triangle and a square. A plan view of each of the upper additional hole UH and the lower additional hole LH is not limited to the description of FIG. 12, and various changes and modifications may be made within the scope of the technical aspects of the inventive concept.

The integrated circuit semiconductor device 100-1 may include the lower support structure LSS and the lower additional holes LH, and may include the upper support structure USS and the upper additional holes UH. The lower support structure LSS does not support all portion of the plurality of lower electrodes LE. The upper support structure USS does not support all portion of the plurality of lower electrodes LE.

FIGS. 14A to 14F are cross-sectional views illustrating a method of manufacturing an integrated circuit semiconductor device, according to an embodiment.

Specifically, FIGS. 14A to 14F are diagrams for explaining a method of manufacturing the integrated circuit semiconductor device 100 of FIGS. 2 and 3. Like reference numerals in FIGS. 14A to 14F denote like elements in FIGS. 2 and 3, and thus their description will be omitted.

Figure 14A:
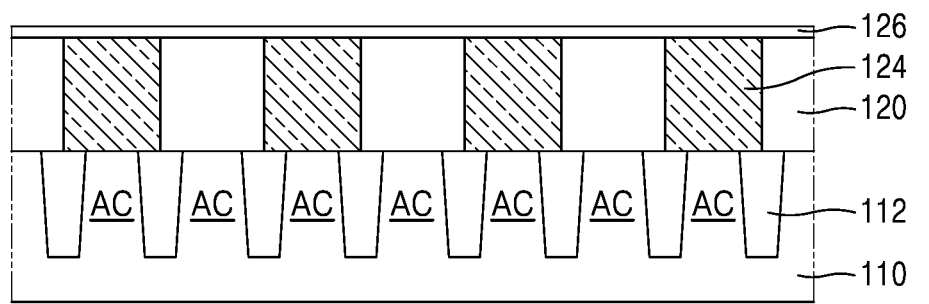
FIGS. 14A to 14F are cross-sectional views illustrating a method of manufacturing an integrated circuit semiconductor device, according to an embodiment.

With reference to FIG. 14A, the lower structure 120 and the conductive area 124 passing through the lower structure 120 and connected to the active area AC may be formed on the substrate 110 of which the active area AC is defined by the device separation area 112. Then, an insulating film 126 to cover the lower structure 120 and the conductive area 124 may be formed.

The insulating film 126 may be used as an etch stop layer in subsequent processes. The insulating film 126 may include an insulator having an etch selectivity with respect to the lower structure 120. In some embodiments, the insulating film 126 may include or may be formed of a silicon nitride film, a silicon carbon nitride film, a silicon nitride film including boron, or a combination thereof.

Figure 14B:
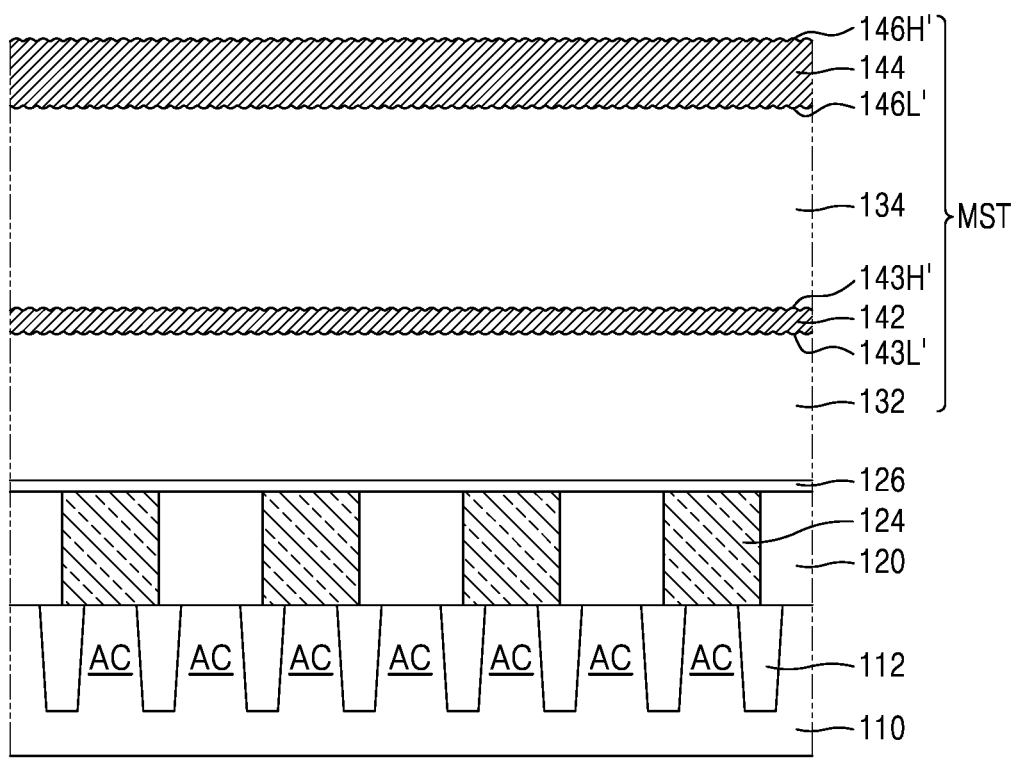

With reference to FIG. 14B, a mold structure MST may be formed on the insulating film 126. The mold structure MST may include a plurality of mold layers and a plurality of support layers. For example, the mold structure MST may include a first mold film 132, a lower support film 142 having lower concavo-convex structures 143L' and 143H', a second mold film 134, and an upper support film 144 having upper concavo-convex structures 146L' and 146H', which are stacked in this stated order on the insulating film 126.

Each of the first mold film 132 and the second mold film 134 may include a material having a relatively high etch rate with respect to etchants including ammonium fluoride (NH$_4$F), hydrofluoric acid (HF), and water so that the material may be removed through a lift-off process by the etchants. In some embodiments, each of the first mold film 132 and the second mold film 134 may include or may be formed of an oxide film, a nitride film, or a combination thereof. However, the material included in the first mold film 132 and the second mold film 134 is not limited to the foregoing, and various changes and modifications may be made within the scope of the technical aspects of the inventive concept. Furthermore, the stacking order of the mold structure MST is not limited to the description of FIG. 14B, and various changes and modifications may be made within the scope of the technical aspects of the inventive concept.

Each of the lower support film 142 having the lower concavo-convex structures 143L' and 143H' and the upper support film 144 having the upper concavo-convex structures 146L' and 146H' may include or may be formed of a silicon carbon nitride film, a silicon nitride film including boron, or a combination thereof. In some embodiments, the lower support film 142 having the lower concavo-convex structures 143L' and 143H' and the upper support film 144 having the upper concavo-convex structures 146L' and 146H' may include or may be formed of the same material. In some embodiments, the lower support film 142 having the lower concavo-convex structures 143L' and 143H' and the upper support film 144 having the upper concavo-convex structures 146L' and 146H' may include or may be formed of different materials.

In some embodiments, the lower support film 142 having the lower concavo-convex structures 143L' and 143H' and the upper support film 144 having the upper concavo-convex structures 146L' and 146H' may respectively include or may be formed of silicon carbon nitride films. In other embodiments, the lower support film 142 having the lower concavo-convex structures 143L' and 143H' may include or may be formed of a silicon carbon nitride film, and the upper support film 144 having the upper concavo-convex structures 146L' and 146H' may include or may be formed of a silicon nitride film including boron. However, according to embodiments of the inventive concept, the material included in the lower support film 142 having the lower concavo-convex structures 143L' and 143H' and the upper support film 144 having the upper concavo-convex structures 146L' and 146H' is not limited to the foregoing, and various changes and modifications may be made within the scope of the technical aspects of the inventive concept.

In some embodiments, the lower concavo-convex structures 143L' and 143H' may be nano-concavo-convex structures obtained by adjusting a thickness uniformity of the lower support film 142. In some embodiments, the lower concavo-convex structures 143L' and 143H' may be obtained by changing a deposition rate, a deposition gas, or a deposition process parameter of the lower support film 142, and adjusting the thickness uniformity of the lower support film 142, when depositing the lower support film 142 on the first mold film 132.

The upper concavo-convex structures 146L' and 146H' may be nano-concavo-convex structures obtained by adjusting a thickness uniformity of the upper support film 144. In some embodiments, the upper concavo-convex structures 146L' and 146H' may be obtained by changing a deposition rate, a deposition gas, or a deposition process parameter of the upper support film 144, and adjusting the thickness uniformity of the upper support film 144, when depositing the upper support film 144 on the second mold film 134.

Figure 14C:
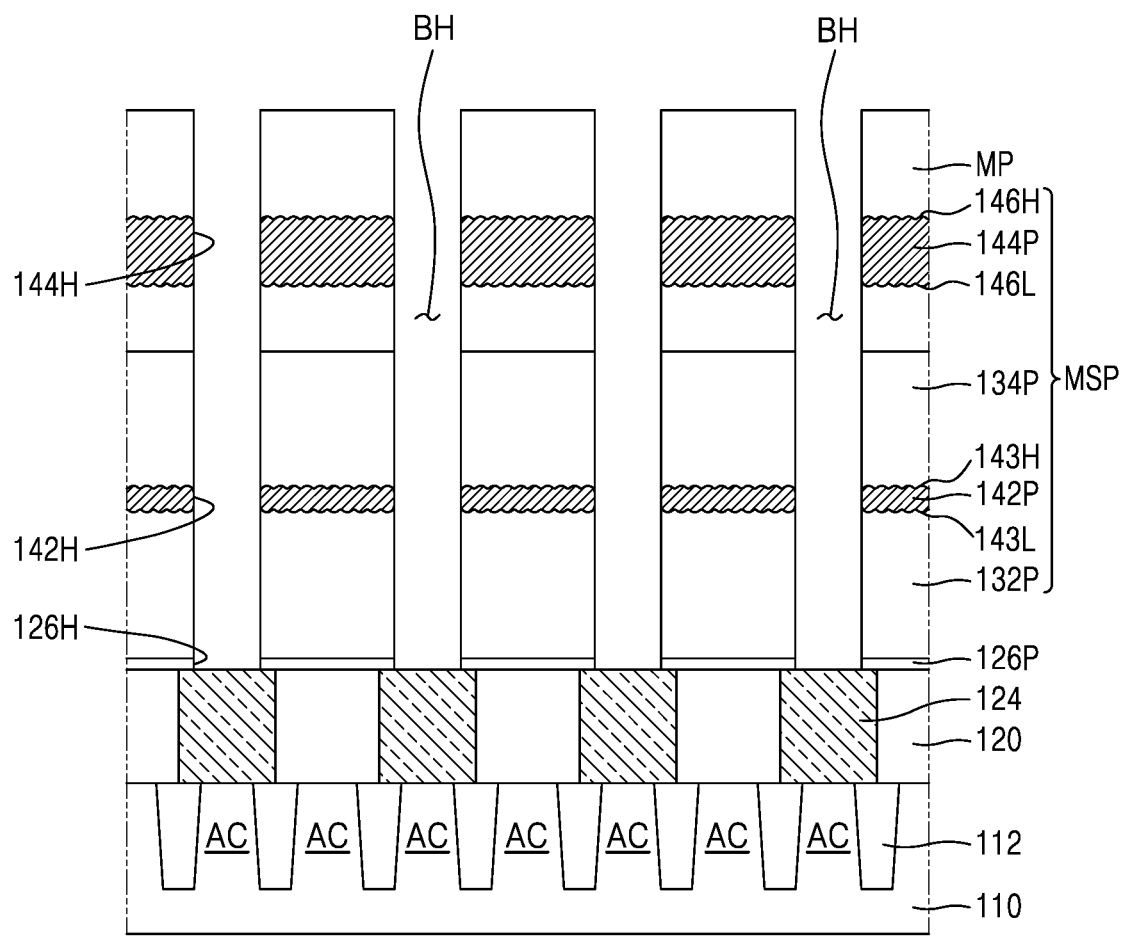
Figure 14C:
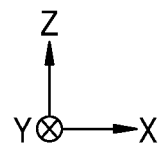

With reference to FIG. 14C, after forming a mask pattern MP on the mold structure MST, a plurality of holes BH may be formed by anisotropically etching the mold structure MST using the mask pattern MP as an etching mask and the insulating film 126 as an etch stop layer. The mask pattern MP may include or may be formed of a nitride film, an oxide film, a polysilicon film, a photoresist layer, or a combination thereof.

As a result, a mold structure pattern MSP defining the plurality of holes BH may be obtained. The mold structure pattern MSP may include a first mold pattern 132P, the lower support pattern 142P having the first lower concavo-convex structure 143L and the second lower concavo-convex structure 143H, a second mold pattern 134P, and the upper support pattern 144P having the first upper concavo-convex structure 146L and the second upper concavo-convex structure 146H.

A process of forming the plurality of holes BH may further include wet-processing a result of anisotropic-etching of the mold structure MST. When performing the anisotropic-etching and wet-processing of the result, the insulating film 126 may also be partially etched, and the insulating pattern 126P having the plurality of openings 126H exposing the plurality of conductive areas 124 may be obtained. In an example process of wet-processing the result of anisotropic-etching, an enchant including diluted sulfuric acid peroxide solution may be used.

Figure 14D:
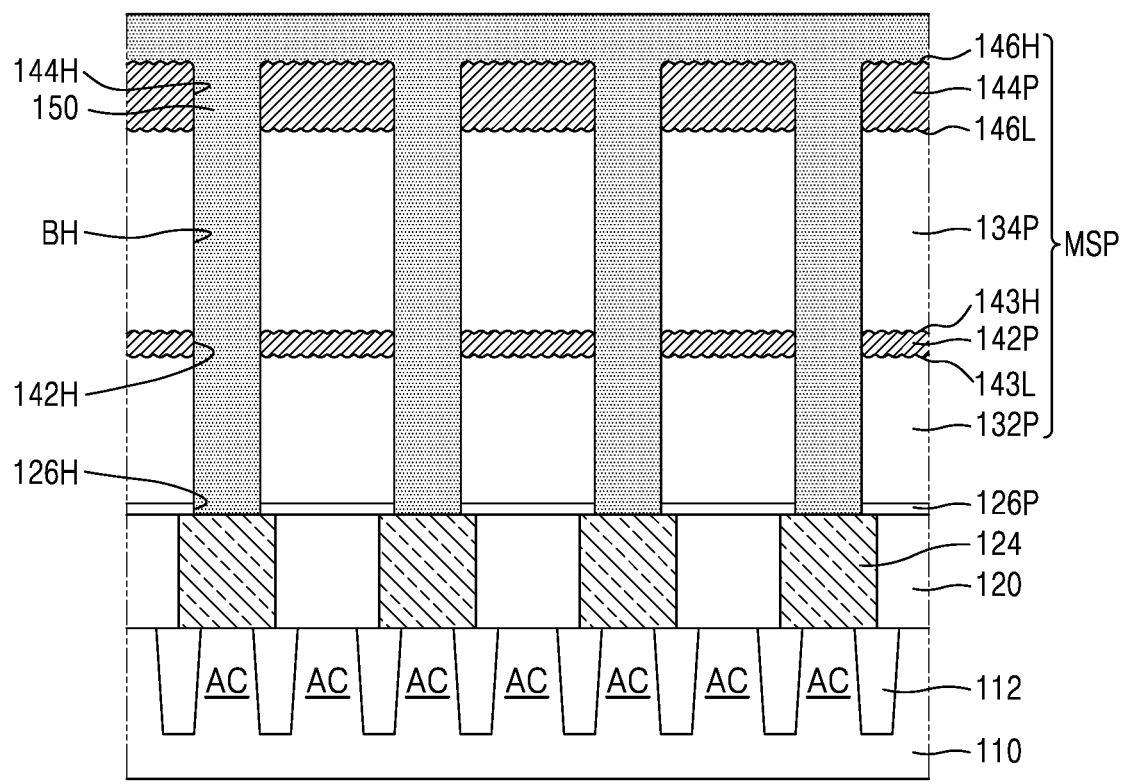

With reference to FIG. 14D, after removing the mask pattern MP, on a result of the removal illustrated in FIG. 14C, a conductive layer 150 may be formed. The conductive layer 150 may be formed to fill the plurality of holes BH. The conductive layer 150 may include a metal film, a conductive metal oxide film, a conductive metal nitride film, a conductive metal oxynitride film, or a combination thereof.

In some embodiments, the conductive layer 150 may include or may be formed of Ti, Ti oxide, Ti nitride, Ti oxynitride, Co, Co oxide, Co nitride, Co oxynitride, Nb, Nb oxide, Nb nitride, Nb oxynitride, Sn, Sn oxide, Sn nitride, Sn oxynitride, or a combination thereof. For example, the conductive layer 150 may include or may be formed of TiN, CoN, NbN, $SnO_2$, or a combination thereof; however, the inventive concept is not limited thereto. To form the conductive layer 150, chemical vapor deposition (CVD), plasma enhanced CVD (PECVD), metal organic CVD (MOCVD), or atomic layer deposition (ALD) may be used.

Figure 14E:
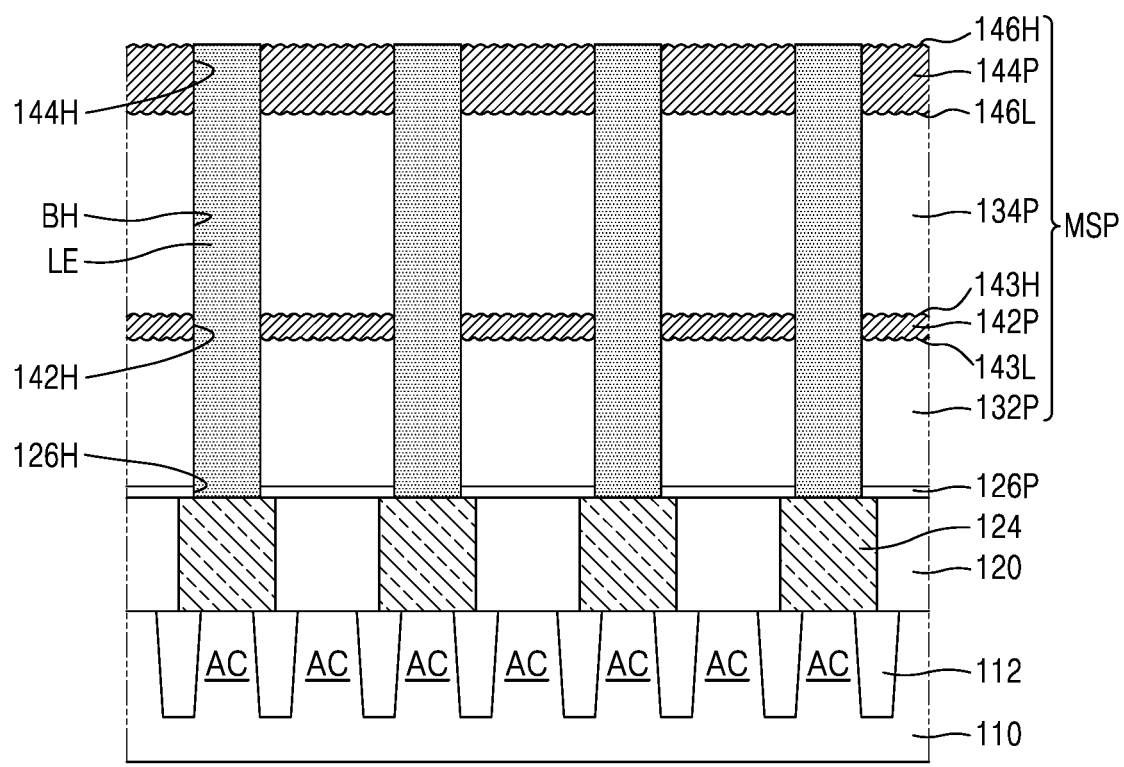

With reference to FIG. 14E, the conductive layer 150 may be partially removed by using an etchback process or a chemical mechanical polishing (CMP) process until an upper surface of the second upper concavo-convex structure 146H, which is the uppermost layer of the mold structure pattern MSP, is exposed in the result described with reference to FIG. 14D. As a result, the plurality of lower electrodes LE formed of remaining portions inside the plurality of holes BH (see FIG. 14D) in the conductive layer 150 may be obtained.

Figure 14F:
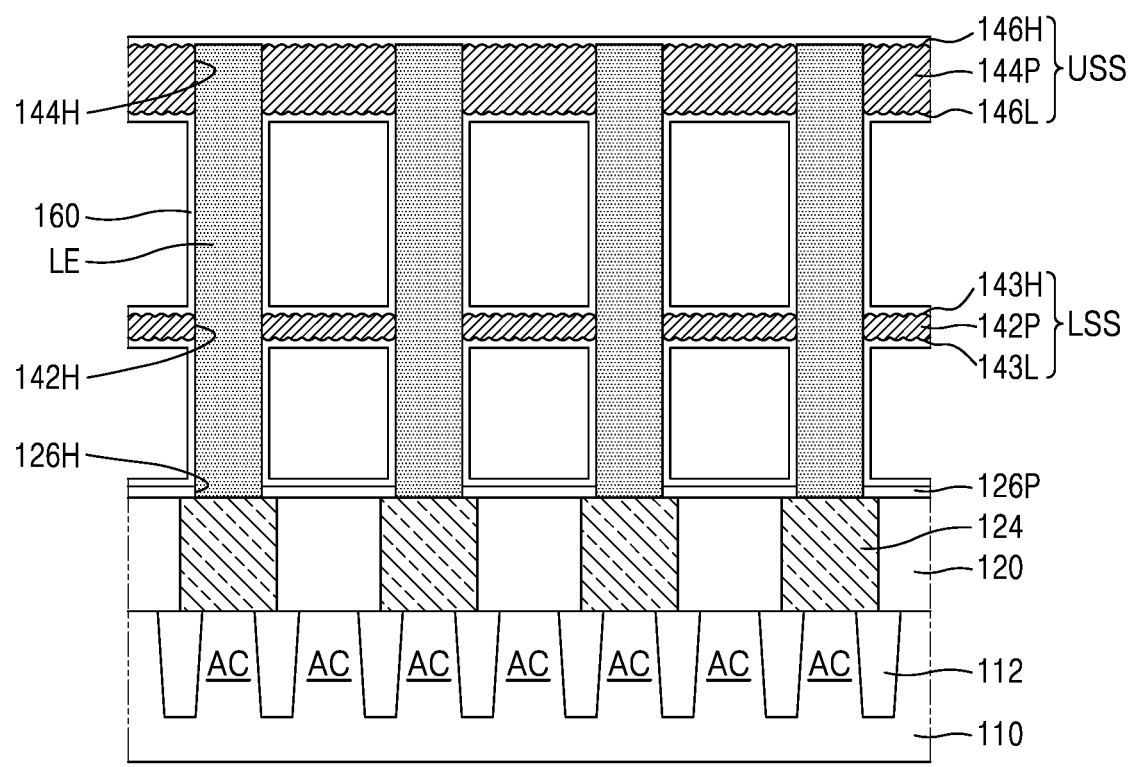

With reference to FIG. 14F, the first mold pattern 132P and the second mold pattern 134P may be removed through a wet process. An enchant including ammonium fluoride ($NH_4F$), hydrofluoric acid (HF), and water may be used in the process of removing the first mold pattern 132P and the second mold pattern 134P through the wet process. After removing the first mold pattern 132P and the second mold pattern 134P, lateral walls of the plurality of lower electrodes LE may be exposed, and in a space between the plurality of lower electrodes LE, the upper support pattern 144P, the first upper concavo-convex structure 146L, the second upper concavo-convex structure 146H, the lower support pattern 142P, the first lower concavo-convex structure 143L, and the second lower concavo-convex structure 143H may remain.

Accordingly, the upper support pattern 144P, the first upper concavo-convex structure 146L, and the second upper concavo-convex structure 146H may be the upper support structure USS, and the lower support pattern 142P, the first lower concavo-convex structure 143L, and the second lower concavo-convex structure 143H may be the lower support structure LSS.

Then, the dielectric film 160 to cover exposed surfaces of the lower electrodes LE may be formed. The ALD process may be used to form the dielectric film 160. The dielectric film 160 may include or may be formed of $HfO_2$, $ZrO_2$, $Al_2O_3$, $La_2O_3$, $Ta_2O_3$, $Nb_2O_5$, $CeO_2$, $TiO_2$, $GeO_2$, or a combination thereof; however, the inventive concept is not limited thereto.

Thereafter, as illustrated in FIG. 3, by forming the upper electrode UE to cover the dielectric film 160, the integrated circuit semiconductor device 100 including the capacitor CP1 may be manufactured. To form the upper electrode UE, the processes of CVD, MOCVD, PVD, or ALD may be used.

Figure 15A:
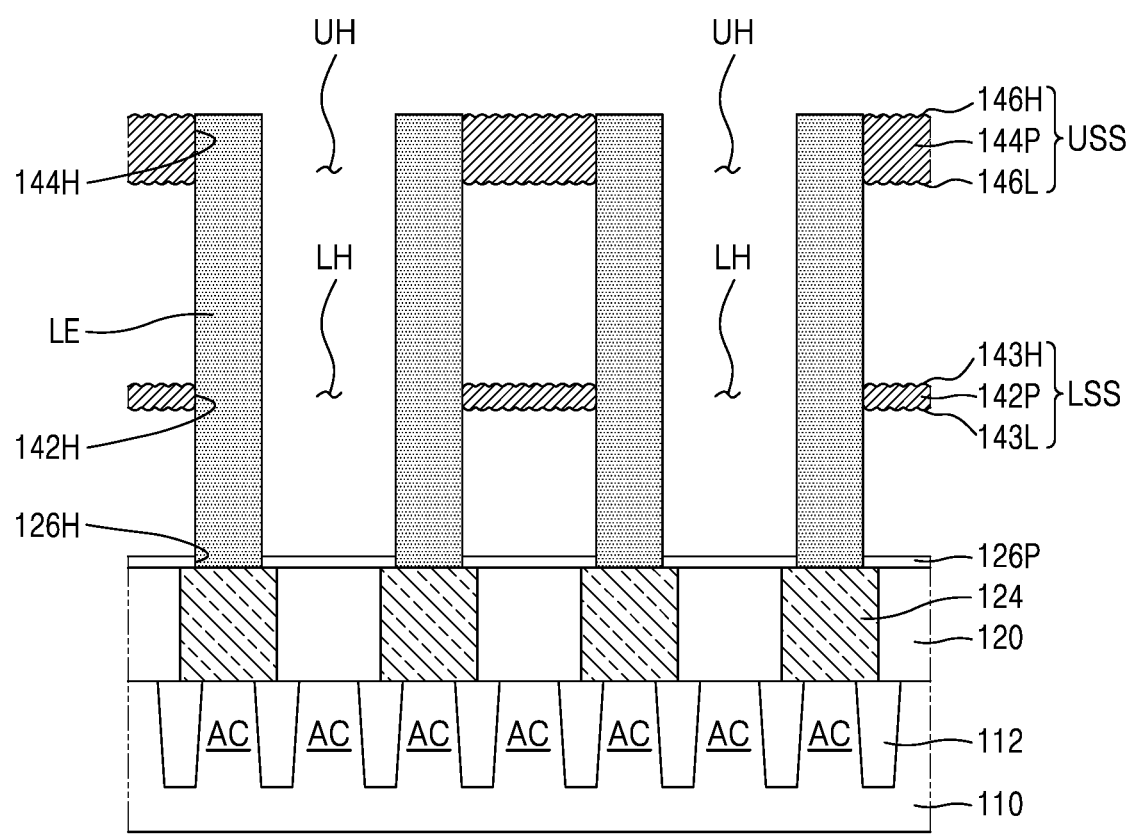
FIGS. 15A and 15B are cross-sectional views illustrating a method of manufacturing an integrated circuit semiconductor device, according to an embodiment.
Figure 15B:
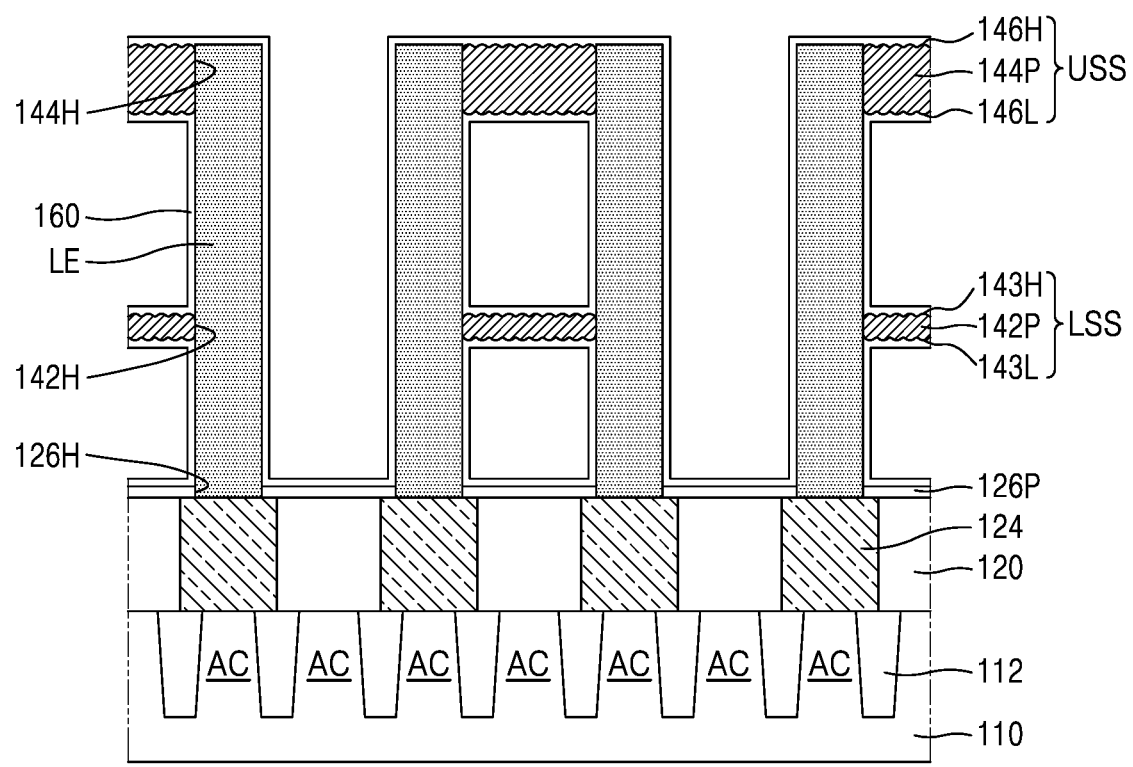

FIGS. 15A and 15B are cross-sectional views illustrating a method of manufacturing an integrated circuit semiconductor device, according to an embodiment.

Specifically, FIGS. 15A and 15B are diagrams for explaining a method of manufacturing the integrated circuit semiconductor device 100-1 of FIGS. 12 and 13. Like reference numerals in FIGS. 15A and 15B denote like elements in FIGS. 12 and 13, and thus their description will be omitted. The method of manufacturing the integrated circuit semiconductor device 100-1 of FIGS. 12 and 13 may include the manufacturing method of FIGS. 14A to 14E.

With reference to FIG. 15A, after performing the manufacturing process of FIG. 14E, the upper support pattern 144P having the first upper concavo-convex structure 146L and the second upper concavo-convex structure 146H may be partially removed to form a plurality of upper holes UH, and through the plurality of upper holes UH, the second mold pattern 134P may be wet-removed.

Then, the lower support pattern 142P having the first lower concavo-convex structure 143L and the second lower concavo-convex structure 143H exposed through the plurality of upper holes UH may be partially removed to form a plurality of lower holes LH, and by wet-removing the first mold pattern 132P through the plurality of lower holes LH, an upper surface of the insulating pattern 126P may be exposed. A plan view of each of the plurality of upper holes UH and the plurality of lower holes LH may be as illustrated in FIG. 12.

The lateral walls of the plurality of lower electrodes LE in the upper hole UH and the lower hole LH and the lateral walls of the lower support pattern 142P having the first lower concavo-convex structure 143L and the second lower concavo-convex structure 143H and the upper support pattern 144P having the first upper concavo-convex structure 146L and the second upper concavo-convex structure 146H may be exposed.

Furthermore, in a space between the plurality of lower electrodes LE, the upper support pattern 144P, the first upper concavo-convex structure 146L, the second upper concavo-convex structure 146H, the lower support pattern 142P, the first lower concavo-convex structure 143L and the second lower concavo-convex structure 143H may remain. The upper support pattern 144P, the first upper concavo-convex structure 146L, and the second upper concavo-convex structure 146H may be the upper support structure USS, and the lower support pattern 142P, the first lower concavo-convex structure 143L, and the second lower concavo-convex structure 143H may be the lower support structure LSS.

With reference to FIG. 15B, the dielectric film 160 to cover exposed surfaces of the lower electrode LE illustrated in FIG. 15A may be formed. The ALD process may be used to form the dielectric film 160. The dielectric film 160 may include or may be formed of $HfO_2$, $ZrO_2$, $Al_2O_3$, $La_2O_3$, $Ta_2O_3$, $Nb_2O_5$, $CeO_2$, $TiO_2$, $GeO_2$, or a combination thereof; however, the inventive concept is not limited thereto.

Thereafter, as illustrated in FIG. 13, by forming the upper electrode UE to cover the dielectric film 160, the integrated circuit semiconductor device 100-1 including the capacitor CP1 may be manufactured. To form the upper electrode UE, the processes of CVD, MOCVD, PVD, or ALD may be used.

Figure 16:
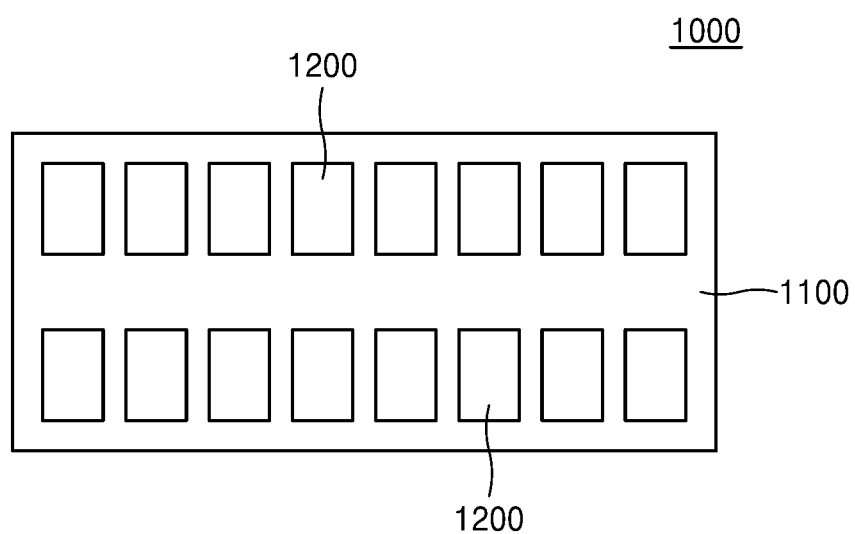
FIG. 16 is a plan view of a memory module including an integrated circuit semiconductor device according to the technical aspects of the inventive concept.

FIG. 16 is a plan view of a memory module including an integrated circuit semiconductor device according to the technical aspects of the inventive concept.

Specifically, a memory module 1000 may include a printed circuit board 1100 and a plurality of semiconductor packages 1200. The plurality of semiconductor packages 1200 may include the integrated circuit semiconductor device 100 or 100-1 according to embodiments of the technical aspects of the inventive concept.

The memory module 1000 according to the technical aspects of the inventive concept may be a single in-lined memory module (SIMM) having the plurality of semiconductor packages 1200 mounted on only one side of a printed circuit board, or a dual in-lined memory module (DIMM) having the plurality of semiconductor packages 1200 arranged on both sides. Furthermore, the memory module 1000 according to the technical aspects of the inventive concept may be a fully buffered DIMM (FBDIMM) having an advanced memory buffer (AMB) configured to provide a signal from the outside to each of the plurality of semiconductor packages 1200.

Figure 17:
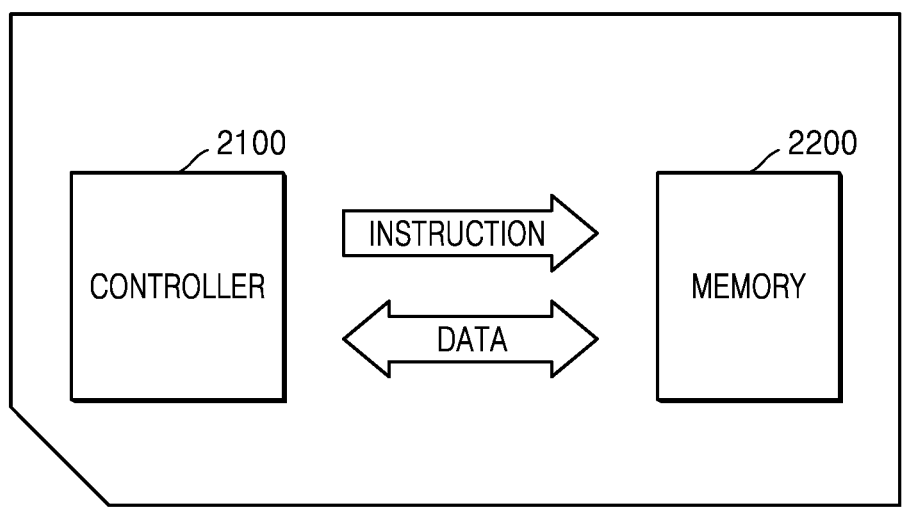
FIG. 17 is a schematic diagram of a memory card including an integrated circuit semiconductor device according to the technical aspects of the inventive concept.

FIG. 17 is a schematic diagram of a memory card including an integrated circuit semiconductor device according to the technical aspects of the inventive concept.

Specifically, a memory card 2000 may be arranged so that a controller 2100 and a memory 2200 may exchange an electronic signal. For example, the memory 2200 may transmit data in response to an instruction from the controller 2100.

The memory 2200 may include the integrated circuit semiconductor device 100 or 100-1 according to embodiments of the technical aspects of the inventive concept. The memory card 2000 may constitute various types of memory cards, for example, a memory stick card, a smart media (SM) card, a secure digital (SD) card, a mini-SD card, a multimedia card (MMC), etc.

Figure 18:
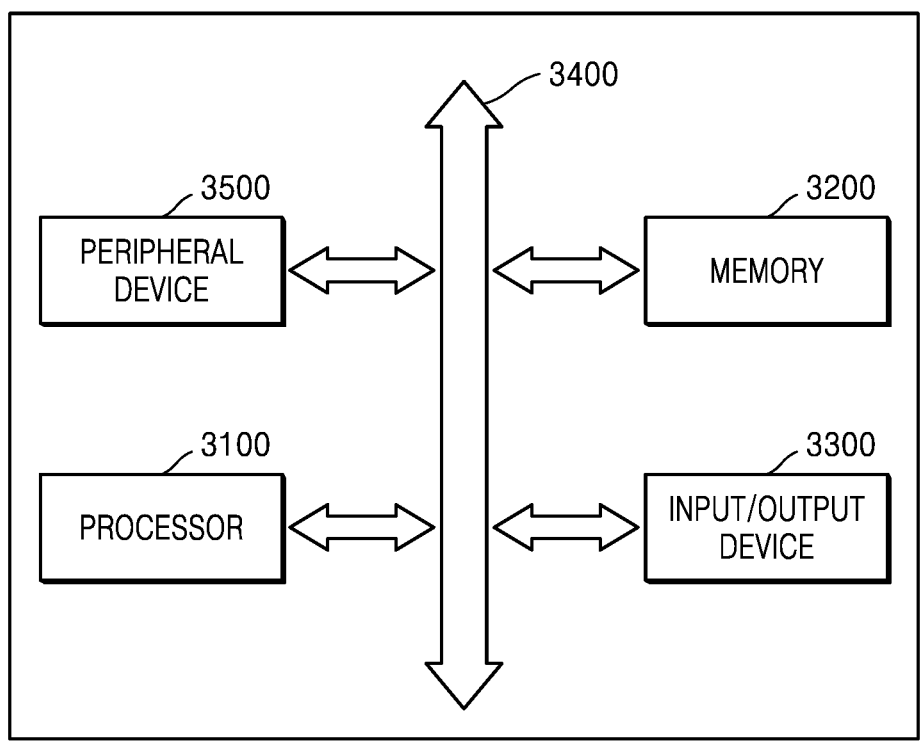
FIG. 18 is a schematic diagram of a system including an integrated circuit semiconductor device according to the technical aspects of the inventive concept.

FIG. 18 is a schematic diagram of a system including an integrated circuit semiconductor device according to the technical aspects of the inventive concept.

Specifically, in a system 3000, a processor 3100, a memory 3200, and an input/output device 3300 may perform mutual data communication by using a bus 3400. The memory 3200 of the system 3000 may include random access memory (RAM) and read only memory (ROM). Furthermore, the system 3000 may include a peripheral device 3500, such as a floppy disk drive and a compact disk (CD) ROM drive.

The memory 3200 may include the integrated circuit semiconductor device 100 or 100-1 according to embodiments of the technical aspects of the inventive concept. The memory 3200 may store codes and data for operations of the processor 3100. The system 3000 may be used in a mobile phone, an MP3 player, a navigation, a portable multimedia player (PMP), a solid state disk (SSD), or household appliances.

While the inventive concept has been particularly shown and described with reference to embodiments thereof, it will be understood that various changes in form and details may be made therein without departing from the spirit and scope of the following claims.

What is claimed is:

1. An integrated circuit semiconductor device comprising:
 a lower electrode formed on a substrate extending in a first direction and a second direction perpendicular to the first direction;
 an upper electrode facing the lower electrode; and
 a support structure supporting the lower electrode,
 wherein the support structure includes
  a support pattern surrounding the lower electrode and extending in the first direction and the second direction, the support pattern having a first hole through which the lower electrode passes in a third direction perpendicular to the first direction and the second direction; and
  a concavo-convex structure having at a surface of the support pattern a plurality of convex portions extending in the third direction, and a plurality of concave portions arranged between the convex portions,
 wherein, in a cross-sectional view of the integrated circuit semiconductor device, the concavo-convex structure extends in the first direction.

2. The integrated circuit semiconductor device of claim 1, wherein the support structure comprises a lower support structure supporting a lower portion of the lower electrode, and an upper support structure spaced apart from the lower support structure in the third direction and supporting an upper portion of the lower electrode.

3. The integrated circuit semiconductor device of claim 1, wherein the support structure further comprises a second hole passing through the support pattern and in a plan view, the second hole has a polygonal shape connecting adjacent lower electrodes.

4. The integrated circuit semiconductor device of claim 1, wherein the support pattern and the concavo-convex structure include the same material.

5. The integrated circuit semiconductor device of claim 1, wherein the concavo-convex structure is a nano-concavo-convex structure formed on the support pattern.

6. The integrated circuit semiconductor device of claim 1, wherein the support pattern and the concavo-convex structure include different materials.

7. The integrated circuit semiconductor device of claim 1, wherein the support pattern and the concavo-convex structure include a silicon carbon nitride film, a silicon nitride film including boron, or a combination thereof.

8. The integrated circuit semiconductor device of claim 1, wherein the concavo-convex structure comprises a first concavo-convex structure formed at a first surface of the support pattern and a second concavo-convex structure formed at a second surface of the support pattern opposite to the first surface of the support pattern.

9. The integrated circuit semiconductor device of claim 1, wherein the concavo-convex structure has a wave shape or a stair shape.

10. The integrated circuit semiconductor device of claim 1, wherein a cross-section of the convex portions constituting the concavo-convex structure has a triangular, rectangular, or elliptical shape.

11. The integrated circuit semiconductor device of claim 1, wherein the support pattern includes a corner portion in contact with the lower electrode, and the corner portion of the support pattern has a curved surface having a thickness tapering off towards the lower electrode.

12. An integrated circuit semiconductor device comprising:
- a plurality of lower electrodes spaced apart from each other on a substrate extending in a first direction and a second direction perpendicular to the first direction;
- a plurality of upper electrodes respectively facing the plurality of lower electrodes;
- a support pattern extending in the first direction and the second direction and having a plurality of first holes through which the plurality of lower electrodes pass in a third direction perpendicular to the first direction and the second direction; and
- a concavo-convex structure having at a surface of the support pattern a plurality of convex portions extending in the third direction, and a plurality of concave portions arranged between the convex portions,
- wherein, in a cross-sectional view of the integrated circuit semiconductor device, the concavo-convex structure extends in the first direction.

13. The integrated circuit semiconductor device of claim 12, wherein the concavo-convex structure includes a cluster structure formed on a surface of the support pattern.

14. The integrated circuit semiconductor device of claim 12, wherein the concavo-convex structure includes a nano-concavo-convex structure formed on the support pattern.

15. The integrated circuit semiconductor device of claim 12, wherein the surface of the support pattern is a flat surface extending in the first direction and the second direction.

16. The integrated circuit semiconductor device of claim 12, wherein a second hole passing through the support pattern is further formed between the plurality of lower electrodes, and in a plan view, the second hole has a polygonal shape connecting adjacent lower electrodes.

17. The integrated circuit semiconductor device of claim 12, wherein the concavo-convex structure comprises a first concavo-convex structure formed at a first surface of the support pattern and a second concavo-convex structure formed at a second surface of the support pattern opposite to the first surface of the support pattern, and
the concavo-convex structure has a wave shape or a stair shape.

18. An integrated circuit semiconductor device comprising:
- a plurality of lower electrodes spaced apart from each other on a substrate extending in a first direction and a second direction perpendicular to the first direction;
- a plurality of upper electrodes respectively facing the plurality of lower electrodes;
- an upper support structure including
  - an upper support pattern extending in the first direction and the second direction and having a plurality of first holes through which the plurality of lower electrodes pass in a third direction perpendicular to the first direction and the second direction, and
  - an upper concavo-convex structure having at a surface of the upper support pattern a plurality of upper convex portions extending in the third direction, and a plurality of upper concave portions arranged between the plurality of upper convex portions;
- a lower support structure including
  - a lower support pattern extending in the first direction and the second direction between the substrate and the upper support structure, and
  - a lower concavo-convex structure having at a surface of the lower support pattern a plurality of lower convex portions extending in the third direction, and a plurality of lower concave portions arranged between the lower convex portions;
- a dielectric film in contact with the plurality of lower electrodes, the upper support structure, and the lower support structure; and
- an upper electrode facing the plurality of lower electrodes with the dielectric film therebetween,
- wherein, in a cross-sectional view of the integrated circuit semiconductor device, the upper concavo-convex structure and the lower concavo-convex structure extend in the first direction.

19. The integrated circuit semiconductor device of claim 18, wherein the upper concavo-convex structure comprises a first upper concavo-convex structure formed at a first surface of the upper support pattern and a second upper concavo-convex structure formed at a second surface of the upper support pattern opposite to the first surface of the upper support pattern, and
the lower concavo-convex structure comprises a first lower concavo-convex structure formed at a first surface of the lower support pattern and a second lower concavo-convex structure formed at a second surface of the lower support pattern s opposite to the first surface of the lower support pattern.

20. The integrated circuit semiconductor device of claim 18, wherein a cross-section of the upper convex portions and the lower convex portions has a triangular, rectangular, or elliptical shape.

* * * * *